(12) United States Patent
Miyasaka et al.

(10) Patent No.: US 9,472,197 B2
(45) Date of Patent: Oct. 18, 2016

(54) AUDIO SIGNAL PROCESSING APPARATUS AND AUDIO SIGNAL PROCESSING METHOD

(71) Applicant: PANASONIC CORPORATION, Osaka (JP)

(72) Inventors: Shuji Miyasaka, Osaka (JP); Satoshi Shinzaki, Osaka (JP); Sin Akamatsu, Osaka (JP); Shuhei Yamada, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 764 days.

(21) Appl. No.: 13/760,820

(22) Filed: Feb. 6, 2013

(65) Prior Publication Data
US 2013/0144631 A1 Jun. 6, 2013

Related U.S. Application Data

(63) Continuation of application No. PCT/JP2011/004602, filed on Aug. 16, 2011.

(30) Foreign Application Priority Data

Aug. 23, 2010 (JP) .................................. 2010-186349

(51) Int. Cl.
*G10L 19/00* (2013.01)
*G10L 19/008* (2013.01)
(Continued)

(52) U.S. Cl.
CPC ............. *G10L 19/008* (2013.01); *G10L 19/26* (2013.01); *H03G 3/3089* (2013.01); *H03G 3/3005* (2013.01)

(58) Field of Classification Search
CPC ... G10L 19/008; G10L 19/02; G10L 19/032; G10L 19/167; G10L 19/26; G10L 19/24; G10L 12/0364; G10L 19/20; G10L 19/22; G10L 25/78; G10L 19/12; G10L 19/173; G10L 2025/783; G10L 21/0316; G10L 21/0364; G10L 25/15; G10L 25/51; G10L 25/93; G10L 19/002; G10L 19/005; G10L 19/018; G10L 19/025; G10L 19/038; G10L 2019/0001; G10L 21/0232; G10L 21/038; G10L 21/04; G10L 25/21; H04S 2420/03
See application file for complete search history.

(56) References Cited

U.S. PATENT DOCUMENTS 6,782,366 B1 *  8/2004  Huang .................. G10L 19/008
                                                    704/224
6,785,655 B1 *  8/2004  Huang .................. G10L 19/008
                                                    704/224

(Continued)

FOREIGN PATENT DOCUMENTS

CN          1291053 A       4/2001
JP      2007-274163 A      10/2007

(Continued)

OTHER PUBLICATIONS

International Search Report issued in International Patent Application No. PCT/JP2011/004602 mailed Nov. 8, 2011.

(Continued)

*Primary Examiner* — Abdelali Serrou
(74) *Attorney, Agent, or Firm* — McDermott Will & Emery LLP

(57) ABSTRACT

An audio signal processing apparatus that processes a bit stream generated by coding an audio signal on a frame-by-frame basis, the bit stream including, for each frame, coded data representing the audio signal, additional data and attribute information, the audio signal processing apparatus including a decoding unit configured to decode the coded data to generate a decoded signal, a processing unit configured to process the decoded signal, a detection unit configured to detect whether or not there has been a change in the attribute information, and a storage unit, wherein the processing unit is configured to, when the change is not detected, process the decoded signal by using at least two pieces of additional data stored, and when the change is detected, process the decoded signal by using only either additional data before detection of the change or additional data after detection of the change.

2 Claims, 10 Drawing Sheets

(51) Int. Cl.
*G10L 19/26* (2013.01)
*H03G 3/30* (2006.01)

(56) References Cited

U.S. PATENT DOCUMENTS

| | | | |
|---|---|---|---|
| 6,856,759 B1* | 2/2005 | Fukuda | G11B 27/034 386/242 |
| 2002/0018490 A1* | 2/2002 | Abrahamsson | G10L 19/02 370/477 |
| 2002/0173950 A1* | 11/2002 | Vierthaler | G10L 21/0364 704/208 |
| 2005/0165608 A1* | 7/2005 | Suzuki | G10L 21/0364 704/261 |
| 2006/0150049 A1* | 7/2006 | Zhang | G10L 19/005 714/746 |
| 2006/0168305 A1* | 7/2006 | Ono | G10L 19/24 709/232 |
| 2007/0237495 A1* | 10/2007 | Terada | G10L 19/005 386/343 |
| 2007/0299653 A1* | 12/2007 | Tanaka | G10L 19/167 704/201 |
| 2008/0071548 A1* | 3/2008 | Moriya | G10L 19/008 704/500 |
| 2008/0080722 A1* | 4/2008 | Carroll | H04R 5/04 381/109 |
| 2008/0084981 A1* | 4/2008 | Lee | H04M 1/6016 379/201.01 |
| 2009/0132242 A1* | 5/2009 | Wang | G10L 21/04 704/216 |
| 2009/0210238 A1* | 8/2009 | Kim | G10L 19/008 704/500 |
| 2009/0222272 A1* | 9/2009 | Seefeldt | G10L 19/008 704/500 |
| 2009/0248409 A1* | 10/2009 | Endo | G10L 21/0364 704/226 |
| 2009/0281803 A1* | 11/2009 | Chen | G10L 21/0208 704/226 |
| 2010/0083344 A1* | 4/2010 | Schildbach | H03G 7/007 725/151 |
| 2010/0198377 A1 | 8/2010 | Seefeldt et al. | |
| 2011/0002482 A1* | 1/2011 | Weiner | G10L 19/008 381/119 |

FOREIGN PATENT DOCUMENTS

| | | |
|---|---|---|
| JP | 2008-078879 A | 4/2008 |
| JP | 2008-078888 A | 4/2008 |
| JP | 2008-288935 A | 11/2008 |
| JP | 2009-289385 A | 12/2009 |
| JP | 2010-114803 A | 5/2010 |
| WO | WO-2008/051347 A2 | 5/2008 |

OTHER PUBLICATIONS

"Information technology—Coding of audio-visual objects—Part 3: Audio" International Standard. ISO/IEC 14496-3. 133 pages. Dec. 1, 2005.

"Subpart 4: General Audio Coding (GA)-AAC, TwinVQ, BSAC." Contents for Subpart 4. ISO/IEC 14496-3. pp. 1-344. 2005.

Zhenhua Che et al., "Dynamic Range Control (DRC) Technology in the MPEG-2 AAC," Audio Engineering, Section 3, Mar. 31, 2001, pp. 8-10, partial English translation.

Chinese Office Action issued in Chinese Application No. 201180035062.0 mailed Apr. 8, 2014, with partial English translation, 9 pgs.

Hoeg et al., "Additional Data Services for DAB: Dynamic Range Control (DRC)," Radio Montreux International Radio Symposium and Technical Exhibition, Engineering Symposium Record, Jun. 9, 1994, pp. 198-196.

Schildbach et al., "Transcoding of dynamic range control coefficients and other Metadata into MPEG-4 HE AAC," AES 12rd Convention, Paper 7217, Oct. 5-8, 2007, pp. 1-8.

Extended European Search Report issued in European Application No. 11819568.4 dated Nov. 14, 2013, 5 pages.

English translation of Zhenhua Che et al., "Dynamic Range Control (DRC) Technology in the MPEG-2 AAC," Audio Engineering, Section 3, Mar. 31, 2001, p. 1-7.

English translation of Chinese Office Action issued in Chinese Application No. 201180035062.0 mailed on Apr. 8, 2014.

* cited by examiner

AUDIO SIGNAL PROCESSING APPARATUS AND AUDIO SIGNAL PROCESSING METHOD

CROSS REFERENCE TO RELATED APPLICATIONS

This is a continuation application of PCT International Application No. PCT/JP2011/004602 filed on Aug. 16, 2011, designating the United States of America, which is based on and claims priority of Japanese Patent Application No. 2010-186349 filed on Aug. 23, 2010. The entire disclosures of the above-identified applications, including the specifications, drawings and claims are incorporated herein by reference in their entirety.

FIELD

The present invention relates to an audio signal processing apparatus and an audio signal processing method that process a bit stream in which an audio signal has been coded. In particular, the present invention relates to an audio signal processing apparatus and an audio signal processing method that decode a bit stream and process a decoded signal by using additional data included in the bit stream which was decoded into the signal.

BACKGROUND

Conventionally, audio signal processing apparatuses are known that generate a decoded signal by decoding a bit stream generated by compression coding an audio signal, and perform predetermined processing on the decoded signal.

For example, audio signal reproduction apparatuses that output a decoded signal as an audible signal, transcoding apparatuses that generate a re-coded signal by re-coding a decoded signal in accordance with a coding scheme that is different from the coding scheme used to code the decoded signal, and the like are known.

With conventional audio signal processing apparatuses, in the case where the bit stream includes, for each frame, DRC (Dynamic Range Control) data for compressing a loud portion, the included DRC data is used to adjust the amplitude of the decoded signal.

For example, Patent Literature 1 discloses a technique in which coding is performed by switching processing (DRC function) that uses DRC data on and off according to the number of channels of the audio signal. For example, in the case of a 5.1ch audio signal, the DRC function is turned on so as to suppress the amplitude of the decoded signal, and in the case of a 2ch audio signal, the DRC function is turned off so as to not suppress the amplitude of the decoded signal. It is thereby possible to prevent a sudden change in audio volume from occurring in a transition portion where the channel of the audio signal changes.

Non Patent Literature (NPL) 1 discloses a technique in which smoothing is performed on DRC data when the DRC data has changed between two successive frames. Smoothing DRC data prevents a sudden change in audio volume from occurring.

CITATION LIST

Patent Literature

[PTL 1] Japanese Unexamined Patent Application Publication No. 2010-114803

Non Patent Literature

[NPL 1] ISO/IEC 14496-3

SUMMARY

Technical Problem

The above conventional techniques are, however, problematic in that depending on the input bit stream, a decoded signal that should be compressed to have a small amplitude is directly output as having a large amplitude. Such a large amplitude portion (see, for example, a portion 9a of the fourth frame shown in FIG. 8) sounds unnatural to the audience, and thus with the conventional techniques, there is a problem in that subjective sound quality degrades.

In view of the above, it is an object of the present invention to provide an audio signal processing apparatus and an audio signal processing method that can suppress a degradation in subjective sound quality (see audio signal 5Bh having inappropriate amplitude 6Bh shown in FIG. 4) and enhance sound quality.

Solution to Problem

In order to achieve the above object, an audio signal processing apparatus according to one aspect of the present invention is an audio signal processing apparatus that processes a bit stream generated by coding an audio signal on a frame-by-frame basis, the bit stream including, for each frame, coded data representing a coded audio signal, additional data (DRC data or the like) on an amplitude of a decoded signal generated by decoding the coded data, and attribute information indicating a property of the coded data (information indicating data for a stereo broadcast or data for a multi-channel broadcast), the audio signal processing apparatus including: a decoding unit configured to decode coded data of a target frame to generate the decoded signal; a processing unit configured to process the decoded signal generated by the decoding unit; a detection unit configured to detect whether or not there has been a change in the attribute information between the target frame (a frame in a first period) and an adjacent frame (a frame in a second period) that is consecutive to the target frame; and a storage unit configured to store at least two pieces of additional data including additional data of the target frame, wherein the processing unit is configured to: when the change is not detected by the detection unit (see period 7A shown in FIG. 5), process the decoded signal of the target frame (process the signal into a signal having an amplitude determined from additional data in the second period) by using the at least two pieces of additional data stored in the storage unit (by using the additional data in the second period as well); and when the change is detected by the detection unit, process the decoded signal of the target frame by using only either at least one piece of additional data before detection of the change or at least one piece of additional data after detection of the change among the additional data stored in the storage unit (without using the additional data in the second period).

With this configuration, when a change has been detected in the attribute information, the decoded signal of the target frame is processed by using only either additional data before detection of the change or additional data after detection of the change (without using the additional data in the second period). That is, the additional data is not used in a manner that extends across the point in time when the change was detected. Specifically, the additional data of a frame in which a property of the audio signal is significantly different (the additional data in the second period having second attribute information that is different from first attribute information in the first period) is not used. It is thereby possible to suppress a degradation in subjective sound quality in the signal generated as a result of processing in the first period. For example, it is possible to prevent a situation in which the amplitude of a decoded signal that should be compressed to be a small amplitude is processed to be a large amplitude (see amplitude 6Bh shown in FIG. 4) that is an inappropriate amplitude. In short, the amplitude is processed to an appropriate amplitude (see amplitude 6Bi shown in FIG. 5), whereby the quality of sound is enhanced.

Also, the adjacent frame may be a frame immediately before the target frame, the storage unit may be configured to store at least two pieces of additional data including the additional data of the target frame and additional data of the adjacent frame, and the processing unit may be configured to: when the change is not detected by the detection unit, process the decoded signal of the target frame by using the additional data of the target frame and the additional data of the adjacent frame; and when the change is detected by the detection unit, process the decoded signal of the target frame by using at least one piece of additional data after detection of the change, including the additional data of the target frame.

With this configuration, at least one piece of additional data after detection of a change is used, and the additional data of a frame before detection of the change having a different property is not used. In other words, the additional data of a frame having the same property as the target frame is used, and the additional data of a frame having a different property is not used, and therefore a degradation in subjective sound quality can be suppressed.

Also, the adjacent frame may be a frame immediately after the target frame, the storage unit may be configured to store at least two pieces of additional data including the additional data of the target frame and additional data of the adjacent frame, and the processing unit may be configured to: when the change is not detected by the detection unit, process the decoded signal of the target frame by using the additional data of the target frame and the additional data of the adjacent frame; and when the change is detected by the detection unit, process the decoded signal of the target frame by using at least one piece of additional data before detection of the change, including the additional data of the target frame.

With this configuration, at least one piece of additional data before detection of a change is used, and the additional data of a frame after detection of the change having a different property is not used. In other words, the additional data of a frame having the same property as the target frame is used, and the additional data of a frame having a different property is not used, and therefore a degradation in subjective sound quality can be suppressed.

Also, the additional data may be DRC data for adjusting the amplitude of the decoded signal, and the processing unit may be configured to increase or decrease the amplitude of the decoded signal of the target frame based on the DRC data.

With this configuration, because the amplitude of the decoded signal is adjusted by using DRC data, the audio volume of the output audio signal can be easily adjusted.

Also, the attribute information may be information indicating the number of channels of the coded audio signal of a corresponding frame, and the detection unit may be configured to detect whether or not there has been a change in the number of channels of the audio signal between the target frame and the adjacent frame by referring to the attribute information.

With this configuration, by determining whether the number of channels is the same or different, it is possible to easily determine whether the frame property has changed significantly. That is, when the number of channels is different between the target frame and the adjacent frame, it is considered that the audio content is different between these frames. Accordingly, the additional data of the frame having different audio content is not applied to the target frame, and thus a degradation in subjective sound quality can be suppressed.

Also, the attribute information may be information indicating a presence or absence of the additional data of a corresponding frame, and the detection unit may be configured to detect a change in the presence or absence of the additional data between the target frame and the adjacent frame by referring to the attribute information.

With this configuration, by determining the presence or absence of the additional data, it is possible to easily determine whether or not the frame property has changed significantly. That is, if the presence or absence of the additional data is different between the target frame and the adjacent frame, it is considered that the audio content is different between these frames. Accordingly, the additional data of the frame having different audio content is not applied to the target frame, and thus a degradation in subjective sound quality can be suppressed.

Also, the processing unit may be configured to: re-code the decoded signal in units of frames of a frame length different from a frame length of the frames included in the bit stream; when the change is not detected by the detection unit, generate additional data corresponding to a re-coded frame by using at least two pieces of additional data stored in the storage unit; and when the change is detected by the detection unit, generate additional data corresponding to a re-coded frame by using only either at least one piece of additional data before detection of the change or at least one piece of additional data after detection of the change among the additional data stored in the storage unit.

With this configuration, when re-coding the decoded signal in units of frames of different frame lengths, appropriate additional data can be generated. It is possible to prevent, for example, a situation in which the additional data for a large amplitude is multiplexed into a frame into which the additional data for a small amplitude should be multiplexed, causing a degradation in subjective sound quality.

Also, the attribute information may be information indicating the number of channels of the coded audio signal of a corresponding frame, the detection unit may be configured to detect whether or not there has been a change in the number of channels of the audio signal between the target frame and the adjacent frame by referring to the attribute information, and the processing unit may be configured to, when the change is detected by the detection unit and a boundary between the target frame and the adjacent frame does not coincide with a boundary between two re-coded frames, generate additional data corresponding to a re-coded frame by using, as either the at least one piece of additional data before detection of the change or at least one piece of additional data after detection of the change, additional data of the frame having a greater number of channels.

With this configuration, in the case where the boundary between the target frame and the adjacent frame, or in other words, the point in time (changing point) when a change in the attribute information was detected and the boundary between re-coded frames do not coincide, additional data corresponding to a re-coded frame is generated by using the additional data of the frame having a greater number of channels. In the case where the changing point and the boundary between re-coded frames do not coincide, a plurality of frames having different properties are re-coded as a single frame. At this time, by using the additional data of the frame having a greater number of channels, the additional data for a small amplitude can be multiplexed as the additional data of the re-coded frame.

Also, the attribute information may be information indicating a presence or absence of the additional data of a corresponding frame, the detection unit may be configured to detect a change in the presence or absence of the additional data between the target frame and the adjacent frame by referring to the attribute information, and the processing unit may be configured to, when the change is detected by the detection unit and a boundary between the target frame and the adjacent frame does not coincide with a boundary between two re-coded frames, generate additional data corresponding to a re-coded frame by using, as either the at least one piece of additional data before detection of the change or at least one piece of additional data after detection of the change, the additional data of the frame in which additional data is present.

With this configuration, in the case where the changing point and the boundary between re-coded frames do not coincide, additional data corresponding to a re-coded frame is generated by using additional data that exists. In the case where the changing point and the boundary between re-coded frames do not coincide, a plurality of frames having different properties are re-coded as a single frame. At this time, by using the existing additional data, the additional data for a small amplitude can be multiplexed as the additional data of the re-coded frame.

Also, the additional data may be DRC data for adjusting the amplitude of the decoded signal, and the processing unit may be configured to generate, based on the DRC data, DRC data for adjusting an amplitude of a re-decoded signal generated by decoding a re-coded frame.

With this configuration, DRC data is multiplexed into a re-coded frame, and thus when the re-coded frame is further decoded, the audio volume of the output audio signal can be easily adjusted.

The present invention can be implemented not only as an audio signal processing apparatus but also as a method in which the units constituting the audio signal processing apparatus and performing processing are implemented as steps.

Advantageous Effects

As described above, with the audio signal processing apparatus and the audio signal processing method according to the present invention, it is possible to suppress a degradation in subjective sound quality (see audio signal 5Bh having inappropriate amplitude 6Bh shown in FIG. 4) and to enhance sound quality.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Hereinafter, embodiments of an audio signal processing apparatus and an audio signal processing method according to the present invention will be described in detail with reference to the drawings.

Embodiment 1

Figure 4:
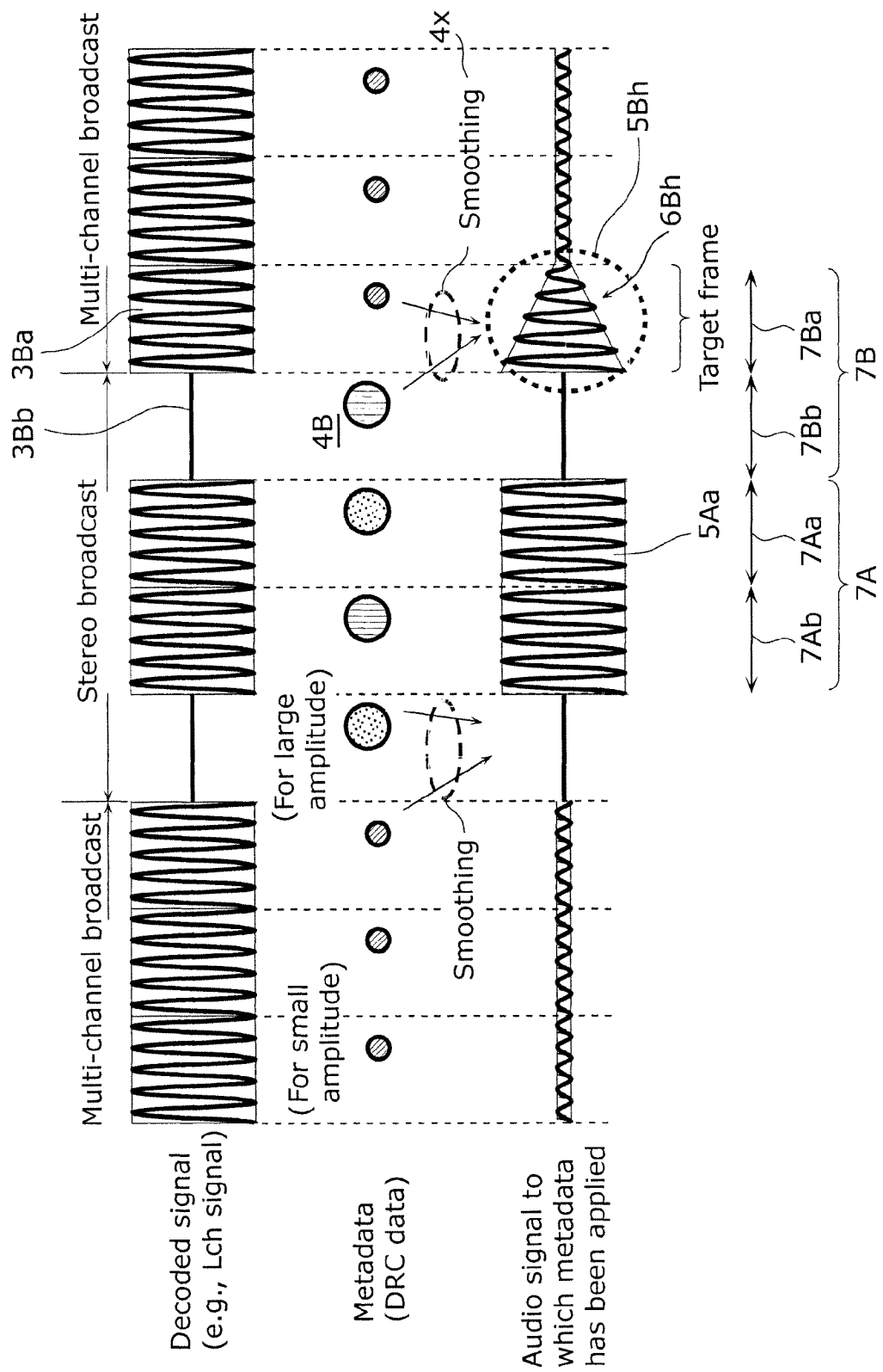
FIG. 4 is a diagram illustrating a problem that is solved by the audio signal processing apparatus according to Embodiment 1 of the present invention.
Figure 5:
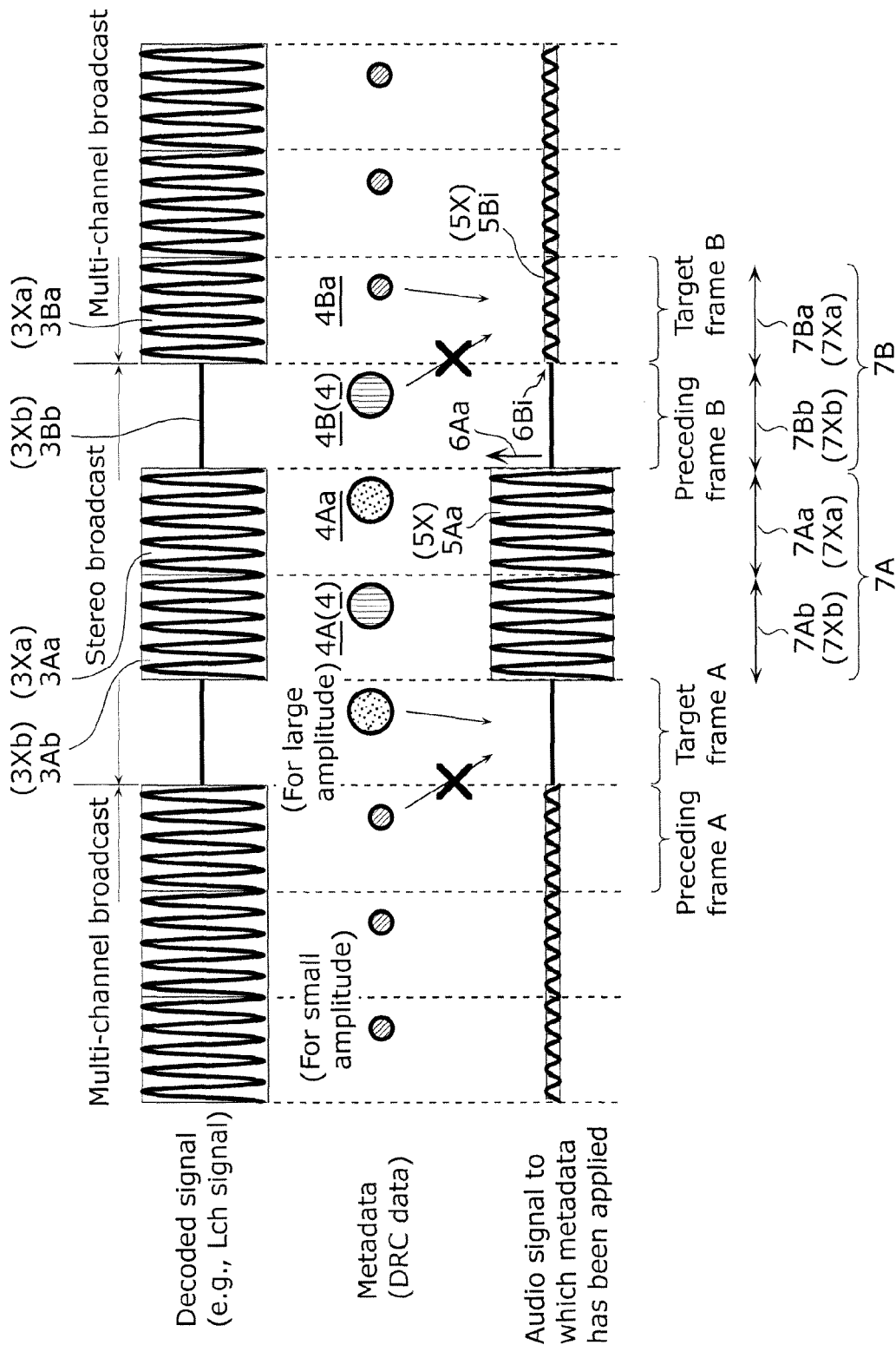
FIG. 5 is a diagram illustrating the operations and effects of the audio signal processing apparatus according to Embodiment 1 of the present invention.

An audio signal processing apparatus (audio signal processing apparatus 100) according to Embodiment 1 of the present invention includes a decoding unit (decoding unit 110) that generates a decoded signal (first audio signal 3Aa shown in FIG. 5) by decoding coded data (see coded data 100f shown in FIG. 1) of a target frame (for example, first period 7Aa shown in FIGS. 4 and 5), a processing unit (processing unit 140) that processes the generated decoded signal (first audio signal 3Aa), a detection unit (detection unit 120) that detects whether or not attribute information (indicating the type of audio signal, or in other words, indicating whether the audio signal is for a multi-channel broadcast or for a stereo broadcast in the case of an example shown in FIG. 5) has changed between the target frame (first period 7Aa, 7Ba) and an adjacent frame (neighboring second period 7Ab, 7Bb), and a storage unit (storage unit 130) for storing at least two or more pieces of additional data (DRC data 4Aa, 4Ba of the target frame, DRC data 4A, 4B of the adjacent frame) including additional data of the target frame (first period 7Aa, 7Ba). The processing unit is configured to, in the case where no change has been detected by the detection unit (in the case of period 7A), process the decoded signal (first audio signal 3Aa) of the target frame (first period 7Aa) by using at least two pieces of additional data stored in the storage unit including the DRC data 4A of the neighboring second period 7Ab, and in the case where a change has been detected by the detection unit (in the case of period 7B), process the decoded signal (first audio signal 3Ba) of the target frame by using only either at least one piece of additional data (DRC data 4B) before detection of the change or at least one piece of additional data (DRC data 4Ba) after detection of the change among the additional data stored in the storage unit (if only either one of these is used, only the one (DRC data 4Ba) that does not result in an inappropriate amplitude (see amplitude 6Bh shown in FIG. 4) if used) (without using the DRC data 4B of the neighboring second period 7Bb).

Figure 6:
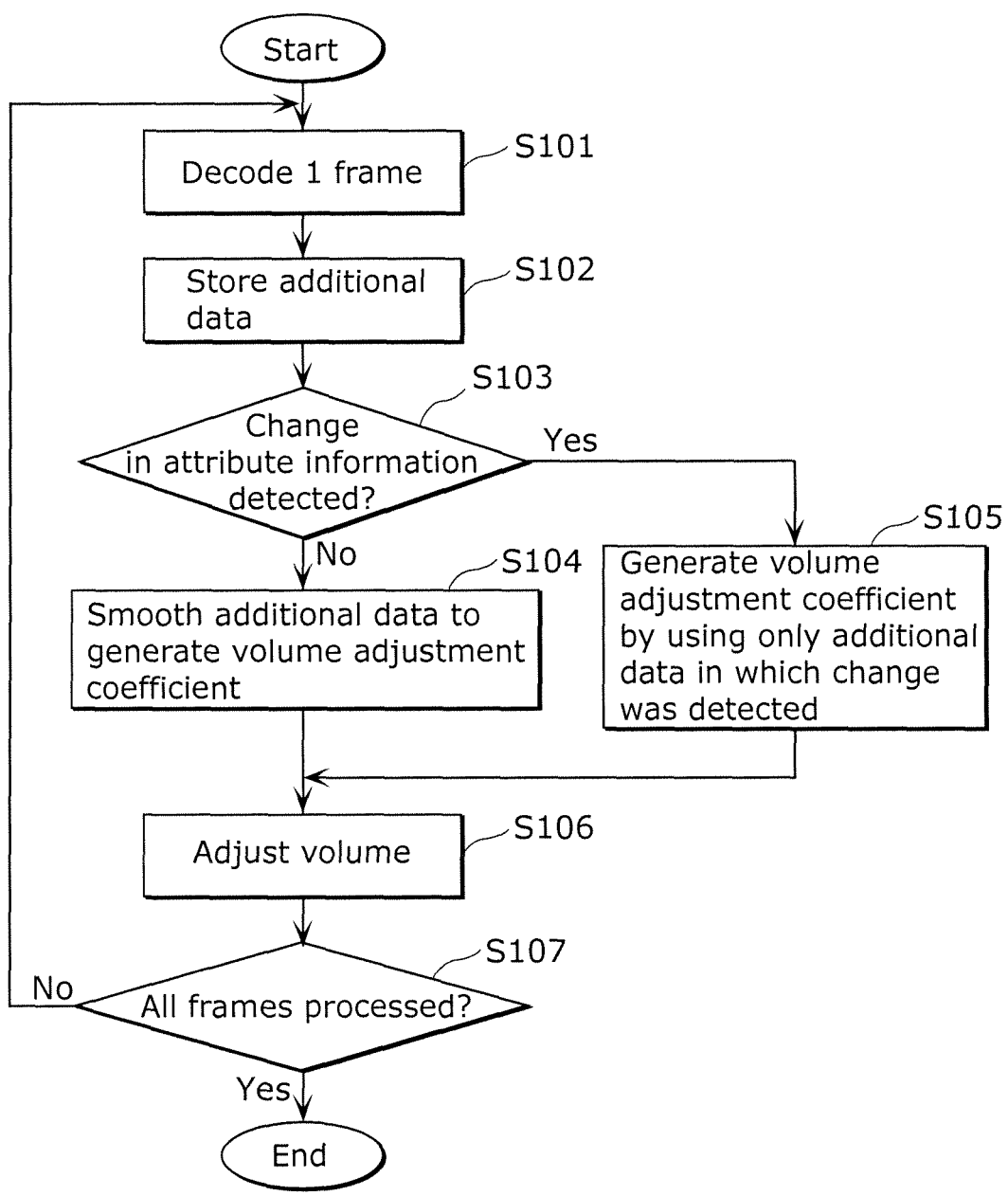
FIG. 6 is a flowchart illustrating an example of operations of the audio signal processing apparatus according to Embodiment 1 of the present invention.

Specifically, for example, it is detected whether or not the type (audio signal for a stereo broadcast or for a multichannel broadcast) of a first audio signal 3Xa is the same as the type of a second audio signal 3Xb that indicates audio in a second period 7Xb close to (similar to, in a neighborhood of) a first period 7Xa of the audio indicated by the first audio signal 3Xa (S103 in FIG. 6). With regard to the DRC data 4 of the second audio signal 3Xb, the amplitude after adjustment with the DRC data 4 will be an appropriate amplitude (for example, amplitude 6Aa shown in FIG. 5) only if the type of signal is the same, and will be an inappropriate amplitude (for example, amplitude 6Bh shown in FIG. 4) if the type of signal is not the same. Only when it has been detected that the type is the same (No in S103, period 7A), the amplitude of a third audio signal 5X (third audio signal 5Aa) that is generated is set to an amplitude (amplitude 6Aa) determined from the DRC data 4 (DRC data 4A) of the nearby second period 7Xb (second period 7Ab), with control for generating a third audio signal 5X having this amplitude being performed or the actual processing for generating this audio signal being performed. When it has been detected that the type is not the same (Yes in S103, period 7B), rather than being set to an amplitude (amplitude 6Bh) determined from the DRC data 4 (DRC data 4B) of the nearby second period 7Xb (second period 7Bb), the amplitude of the third audio signal 5X is set to another amplitude (an amplitude determined from data other than the DRC data 4 (for example, only DRC data 4Ba)).

This results not only in the processed third audio signal (third audio signal 5Aa) that has undergone processing being an audio signal of high sound quality in the case of the period 7A.

Specifically, in the case of the period 7B, a situation in which the processed second audio signal is an audio signal of low sound quality (second audio signal 5Bh having inappropriate amplitude 6Bh shown in FIG. 4) can be avoided, and an audio signal of high sound quality (second audio signal 5Bi of appropriate amplitude 6Bi shown in FIG. 5) can be obtained.

It is thereby possible, in either case, to increase the level of sound quality and reliably enhance sound quality.

The configuration of the audio signal processing apparatus according to Embodiment 1 of the present invention will be described first.

Figure 1:
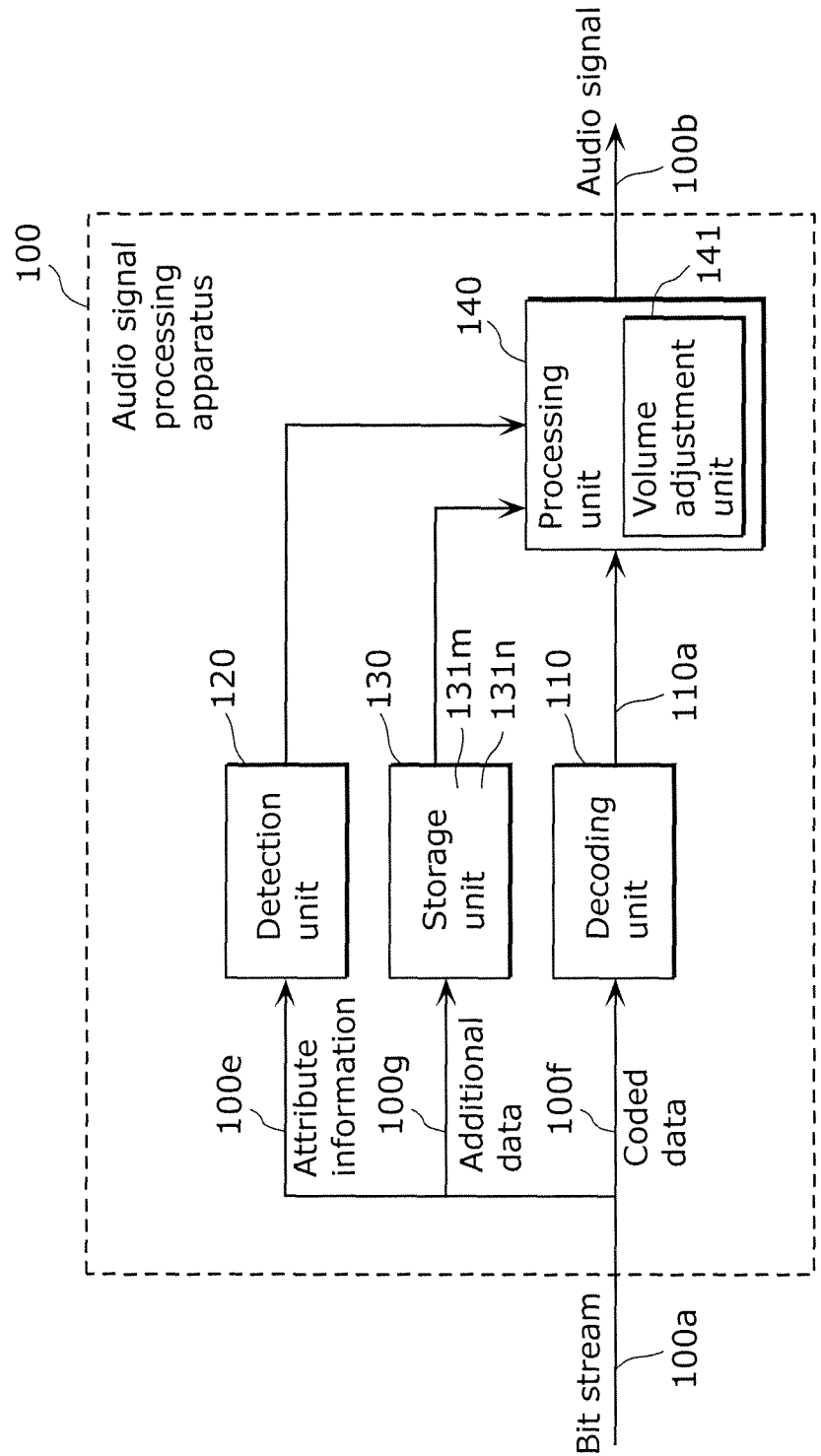
FIG. 1 is a block diagram showing an example of a configuration of an audio signal processing apparatus according to Embodiment 1 of the present invention.

FIG. 1 is a block diagram showing an example of a configuration of the audio signal processing apparatus 100 according to Embodiment 1 of the present invention.

The audio signal processing apparatus 100 processes a bit stream in which an audio signal has been coded on a frame-by-frame basis.

The audio signal processing apparatus 100 according to Embodiment 1 of the present invention decodes a bit stream (bit stream 100a) and thereby generates a decoded signal obtained as a result of the bit stream being decoded. Then, the audio signal processing apparatus 100 adjusts the audio volume of the generated decoded signal and outputs the adjusted decoded signal as an audible signal.

The bit stream input into the audio signal processing apparatus 100 will now be described with reference to FIG. 2.

Figure 2:
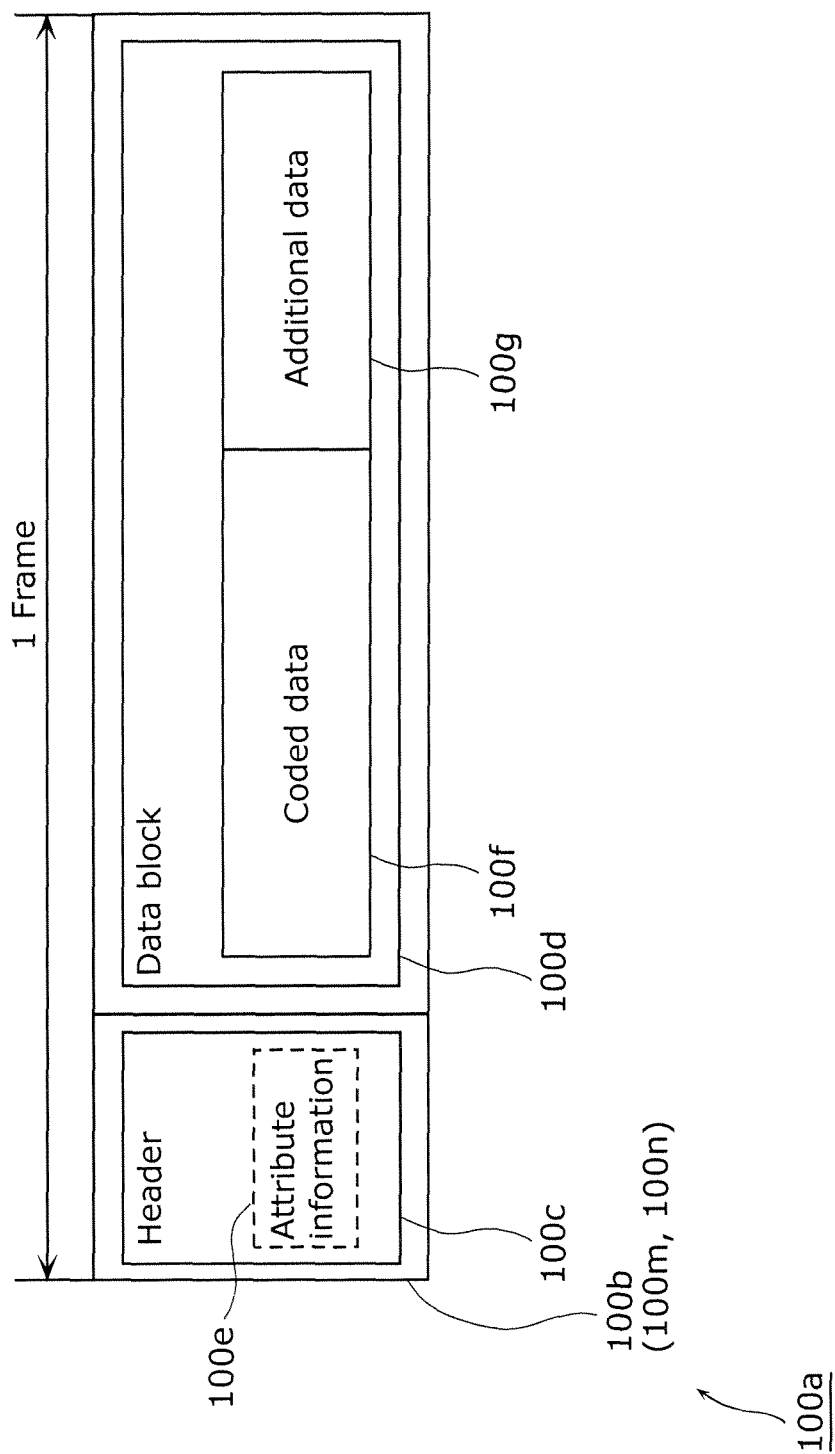
FIG. 2 is a diagram showing an example of a structure of a bit stream that is input into the audio signal processing apparatus according to Embodiment 1 of the present invention.

FIG. 2 is a diagram showing an example of a structure of the bit stream that is input into the audio signal processing apparatus 100 according to Embodiment 1 of the present invention.

FIG. 2 shows only one (frame 100b) of a plurality of frames constituting the bit stream.

The single frame (frame 100b) of the bit stream includes, as shown in FIG. 2, a header (header 100c) and a data block (data 100d). The header includes information (attribute information) 100e. The data block includes coded data and additional data (metadata) (data 100f, additional data 100g).

The coded data is data representing a coded audio signal. Specifically, the coded data represents a single frame's worth of audio signal that has a length of time corresponding to the length of a single frame (see frame 2f or the like shown in FIG. 3) and that has been coded based on a predetermined coding standard.

The additional data is data regarding the amplitude of the decoded signal generated by decoding the coded data.

Specifically, the additional data is DRC data for adjusting the amplitude of the decoded signal, or the like. By using the DRC data, the amplitude of the decoded signal can be increased or reduced.

The attribute information is information indicating the property of the coded data.

For example, the attribute information indicates the number of channels of the coded audio signal of the frame corresponding to that attribute information (the frame whose header includes that attribute information).

Specifically, the attribute information indicates whether the audio signal is for a multi-channel broadcast (5.1ch, 7.1ch or the like) or for a stereo broadcast (2ch).

As described above, the bit stream includes coded data (data 100f) sectioned into frames, each including additional data and attribute information that correspond to each of the one or more pieces of coded data included in the bit stream.

The locations of the attribute information and the additional data in the frame shown in FIG. 2 are merely exemplary, and thus are not limited to the example shown in FIG. 2. For example, the additional data may be included in the header, or the attribute information may be included in the additional data. Furthermore, the attribute information and the additional data may be included in both the header and the data block.

Referring back to FIG. 1, the audio signal processing apparatus 100 includes a decoding unit 110, a detection unit 120, a storage unit 130, and a processing unit 140.

The decoding unit 110 decodes the coded data of a target frame (for example, target frame 2fx shown in FIG. 3) and thereby generates a decoded signal (for example, first audio signal 3Ba or the like shown in FIG. 4) obtained as a result of the coded data being decoded.

The detection unit 120 detects whether or not the attribute information has changed between the target frame (for example, frame 100m shown in FIG. 2 (see period 7Xa shown in FIG. 5)) and an adjacent frame (frame 100n (see period 7Xb shown in FIG. 5)) that is consecutive to (adjacent to) the target frame.

In other words, the detection unit 120 detects whether or not the attribute information of the coded data has changed between two successive frames, namely, the target frame and the adjacent frame.

For example, the detection unit 120 detects whether or not the number of channels of the audio signal has changed between the target frame and the adjacent frame by referring to the attribute information.

The adjacent frame is, for example, a frame (preceding frame) immediately before the target frame in the order of input or processing.

The storage unit 130 is a memory for storing at least two pieces of additional data including the additional data of the target frame. Specifically, the storage unit 130 stores at least two pieces of additional data including the additional data of the target frame (additional data 131*m* of frame 100 shown in FIG. 1) and the additional data of the adjacent frame (additional data 131*n* of frame 100*n*).

The processing unit 140 processes the signal (decoded signal) 110*a* (FIG. 1) generated by the decoding unit 110.

Specifically, the processing unit 140 performs the following operation if a change is not detected in the attribute information between the target frame and the adjacent frame by the detection unit 120.

This operation involves processing of the decoded signal of the target frame by using both of the at least two pieces of additional data stored in the storage unit 130.

If, on the other hand, a change is detected in the attribute information between the target frame and the adjacent frame by the detection unit 120, the processing unit 140 performs the following operation.

This operation involves processing of the decoded signal of the target frame by using only either at least one piece of additional data before detection of the change or at least one piece of additional data after detection of the change among the additional data stored in the storage unit 130.

According to Embodiment 1 of the present invention, the processing unit 140 includes a volume adjustment unit 141 shown in FIG. 1

The volume adjustment unit 141 adjusts the audio volume of the decoded signal of the target frame by using the additional data.

For example, the volume adjustment unit 141 calculates a volume adjustment coefficient by using the DRC data (additional data 100*g*) of the target frame, and adjusts the amplitude of the decoded signal of the target frame by using the calculated coefficient.

If the DRC data (additional data 131*m*) of the target frame and the DRC data (additional data 131*n*) of the preceding frame are different, the volume adjustment unit 141 smoothes the DRC data of the target frame and the DRC data of the preceding frame so as to calculate a volume adjustment coefficient. Then, the volume adjustment unit 141 adjusts the amplitude of the decoded signal of the target frame (frame 100*m*) by using the calculated coefficient.

Hereinafter, volume adjustment processing that uses additional data will be described in detail with reference to FIG. 3.

Figure 3:
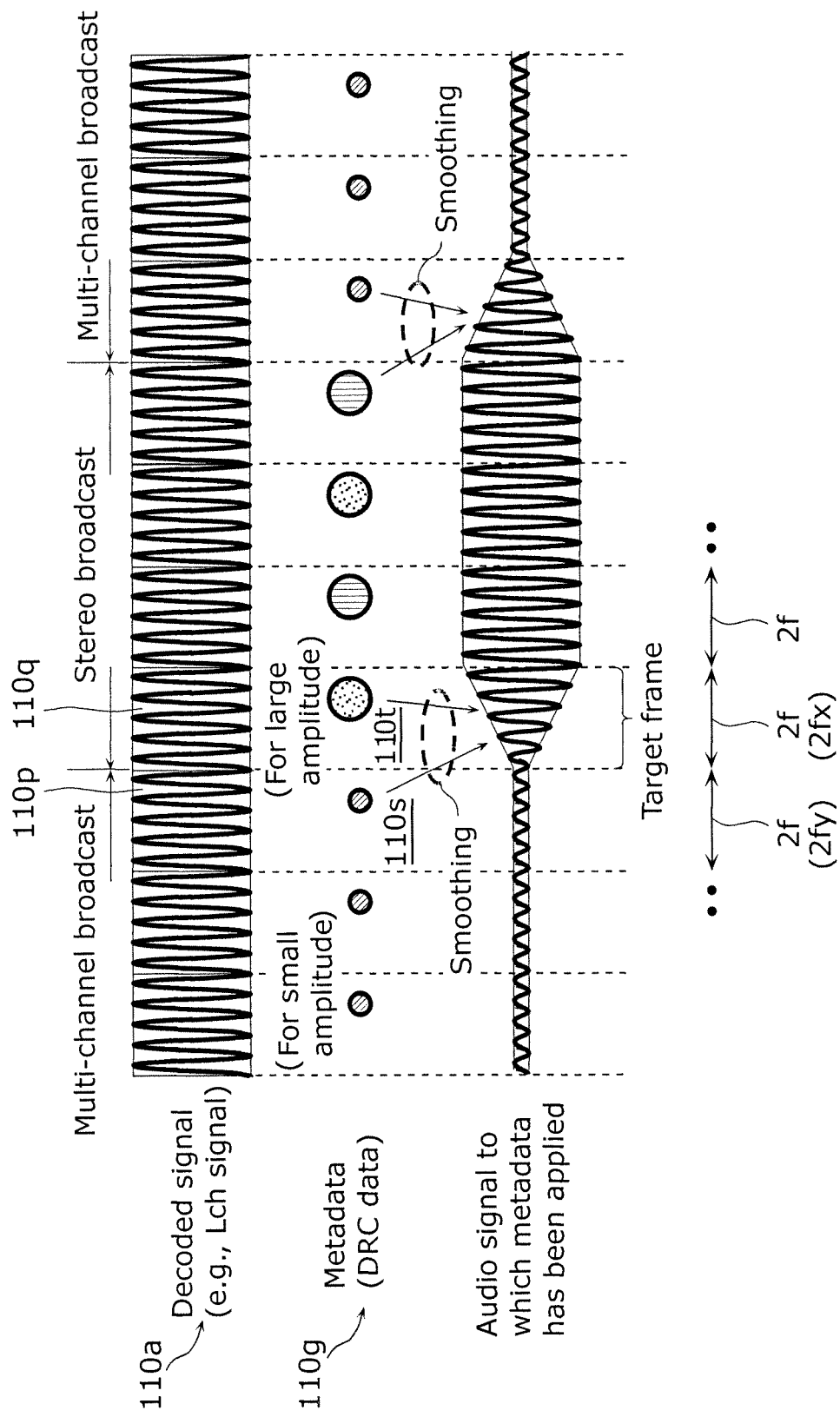
FIG. 3 is a diagram illustrating an example of volume adjustment processing that uses additional data according to Embodiment 1 of the present invention.

FIG. 3 is a diagram illustrating an example of the volume adjustment processing that uses additional data according to Embodiment 1 of the present invention.

In an example shown in FIG. 3, a signal (decoded signal) 110*a* includes an audio signal for a multi-channel broadcast (audio signal 110*p* or the like) and an audio signal for a stereo broadcast (audio signal 110*q* or the like).

The decoded signal is sectioned into frames, and each frame (frame 2*f*) includes DRC data (DRC data 110*s*, 110*t* or the like) as additional data (metadata, additional data 100*g*).

In the case of a frame for a multi-channel broadcast (frame 2*f* of signal 110*p*), the DRC data (additional data) of the frame is DRC data for a small amplitude that reduces the amplitude of the decoded signal.

Likewise, in the case of a frame for a stereo broadcast (frame 2*f* of signal 110*q*), the DRC data (additional data) of the frame is DRC data for a large amplitude that increases the amplitude of the decoded signal.

In the case of a stereo broadcast, usually, two speakers are used, whereas in the case of a multi-channel broadcast, more speakers, for example, six speakers are used. Accordingly, when a decoded signal having the same amplitude is output, the audio of the multi-channel broadcast sounds louder. Accordingly, DRC data that reduces the amplitude of the decoded signal of the multi-channel broadcast is added.

As described above, DRC data for a small amplitude (or DRC data for a large amplitude) is consistently added to audio signals for a multi-channel broadcast (or a stereo broadcast), as shown in the example of FIG. 3.

The foregoing is merely an example, and two pieces of DRC data that are different from each other may be added to the audio signals for a multi-channel broadcast. That is, DRC data can be freely set for each frame.

For example, by using the DRC data for a small amplitude, the volume adjustment unit 141 (FIG. 1) can reduce the amplitude of the decoded signal as compared to when the DRC data for a large amplitude is used.

If the DRC data is different between two frames that are sequential in time (for example, the target frame and the adjacent frame), the volume adjustment unit 141 smoothes the DRC data (see also smoothing 4*x* shown in FIG. 4). It is thereby possible to smoothly change audio volume.

For example, in the case of adjusting the audio volume of the target frame (target frame 2*fx*) shown in FIG. 3, the volume adjustment unit 141 smoothes the DRC data (for a large amplitude) of the target frame and the DRC data (for a small amplitude) of the preceding frame (adjacent frame 2*fy*).

Smoothing refers to, for example, the following processing. Specifically, in that processing, the DRC data of the preceding frame is used for the first sample within a frame, and the DRC data of the target frame is used for the last sample within the frame. Then, the remaining samples are processed so as to attain amplitudes that are intermediate between the amplitude in the first sample and the amplitude in the last sample, in order to make the change in amplitude smooth.

As described above, in the case where the DRC data changes, smoothing is performed between the DRC data before the change and the DRC data after the change, as a result of which audio volume can be smoothly changed.

However, for example, in the case where smoothing of the DRC data is performed on a decoded signal as shown in FIG. 4, a problem arises in that a decoded signal that should be compressed to have a small amplitude is directly output as having a large amplitude (see inappropriate amplitude 6Bh).

FIG. 4 is a diagram illustrating a problem that is solved by the audio signal processing apparatus according to Embodiment 1 of the present invention.

The decoded signal shown in FIG. 4 includes silent frames in the first and last segments among four segments of the audio signal for a stereo broadcast. It illustrates a case where, for example, a stereo broadcast such as a commercial (CM) is inserted in a multi-channel broadcast such as a movie.

As shown in FIG. 4, the DRC data of the target frame and the DRC data of the preceding frame are different, and thus the volume adjustment unit 141 performs smoothing on these DRC data.

By doing so, with respect to the target frame for a multi-channel broadcast (see period 7Ba), which is a frame whose audio volume should be adjusted so as to have a small amplitude, the amplitude of the decoded signal is adjusted from a large amplitude to a small amplitude. Accordingly, the decoded signal having a large amplitude is output suddenly from a silent state, and thus the decoded signal of this portion would sound harsh to the audience.

In other words, a degradation in subjective sound quality cannot be prevented by simply smoothing the DRC data.

In contrast, the audio signal processing apparatus 100 according to Embodiment 1 of the present invention detects a change in the attribute information, and if the attribute information has changed (Yes in S103 in FIG. 6 described later), the amplitude of the decoded signal is adjusted by using only either the DRC data before detection of the change or the DRC data after detection of the change (if only either one of these is used, the one that does not result in the inappropriate amplitude 6Bh).

Specifically, in the case where a plurality of pieces of DRC data used for smoothing extend across the point in time (changing point) when a change occurred in the attribute information, the audio signal processing apparatus 100 does not use the plurality of pieces of DRC data in a manner that extends across the changing point.

With this configuration, in a portion of the decoded signal in which a significant change has occurred due to the change in the attribute information, smoothing of the DRC data corresponding to different attribute information is not performed, and therefore it is possible to prevent unnatural sound from being output.

If the attribute information has not changed, the audio signal processing apparatus 100 according to Embodiment 1 of the present invention smoothes the DRC data. This prevents a sudden change in audio volume.

Next, specific operations of the audio signal processing apparatus 100 according to Embodiment 1 of the present invention will be described.

FIG. 5 is a diagram illustrating the operations and effects of the audio signal processing apparatus 100 according to Embodiment 1 of the present invention.

In the present embodiment, the processing unit 140 processes the decoded signal by using the additional data of the target frame and the additional data of the adjacent frame (preceding frame) that is immediately before the target frame if a change is not detected by the detection unit 120 (see period 7A or the like). Specifically, the volume adjustment unit 141 of the processing unit 140 smoothes the DRC data of the target frame and the DRC data of the preceding frame. In FIG. 5, the DRC data 4A and the DRC data 4Aa are hatched in different patterns. That is, for example, the DRC data 4A and the DRC data 4Aa shown in FIG. 5 may be different by a certain degree, which is schematically shown using different patterns.

If, on the other hand, a change is detected by the detection unit 120 (see period 7B or the like), the processing unit 140 processes the decoded signal by using at least one piece of additional data after detection of the change, including the additional data of the target frame.

For example, in the example shown in FIG. 5, the attribution information changes between the target frame A and the preceding frame A and between the target frame B and the preceding frame B.

Specifically, the attribute information of the preceding frame A indicates that the preceding frame A is for a multi-channel broadcast, and the attribute information of the target frame A indicates that the target frame A is for a stereo broadcast.

Likewise, the attribute information of the preceding frame B indicates that the preceding frame B is for a stereo broadcast, and the attribute information of the target frame B indicates that the target frame B is for a multi-channel broadcast.

Accordingly, the volume adjustment unit 141, when processing the decoded signal of the target frame A, adjusts the audio volume by using the DRC data of the target frame A, which is the frame after detection of the change.

Likewise, the volume adjustment unit 141, when processing the decoded signal of the target frame B, adjusts audio volume by using the DRC data of the target frame B, which is the frame after detection of the change.

At this time, the DRC data of the preceding frame B is not used, and thus for the target frame B, only the DRC data for a small amplitude is used. It is thereby possible to prevent an audio signal (audio signal 5Bh) having a large amplitude, as shown in FIG. 4, from being generated.

The processing unit 140 may use the additional data of the target frame B when processing the target frame B.

In other words, it is sufficient that the processing unit 140 does not use the additional data of the frame before the changing point at which the attribute information changed, specifically, the additional data of the frame prior to the target frame B, and thus the processing unit 140 may use the additional data of a frame after the changing point at which the attribute information changed.

FIG. 6 is a flowchart illustrating an example of operations of the audio signal processing apparatus according to Embodiment 1 of the present invention.

First, the decoding unit 110 decodes a single frame's worth of coded data so as to generate a decoded signal (S101). In other words, the decoding unit 110 decodes the coded data of the target frame.

Next, the storage unit 130 stores the additional data of the target frame (S102).

Next, the detection unit 120 detects whether or not the attribute information has changed (S103).

Specifically, the detection unit 120 detects whether or not the attribute information has changed between the preceding frame and the target frame.

In other words, the detection unit 120 detects whether the attribution information of the preceding frame and the attribute information of the target frame are the same or different.

In the present embodiment, the detection unit 120 detects whether or not the number of channels of the preceding frame and the number of channels of the target frame are the same by, for example, referring to the attribute information.

If the number of channels of the preceding frame and the number of channels of the target frame are the same, the detection unit 120 determines that the attribute information has not changed. If the number of channels of the preceding frame and the number of channels of the target frame are different, the detection unit 120 determines that the attribute information has changed.

If a change is not detected in the attribute information (No in S103), the volume adjustment unit 141 smoothes the additional data, and generates a volume adjustment coefficient (S104). If the DRC data of the preceding frame and the DRC data of the target frame are the same, smoothing does not need to be performed.

If a change is detected in the attribute information (Yes in S103), the volume adjustment unit 141 generates a volume adjustment coefficient by using only the additional data after detection of the change (S105).

Specifically, the volume adjustment unit 141 generates a volume adjustment coefficient by using only the DRC data of the target frame, as shown in FIG. 5.

Finally, the volume adjustment unit 141 adjusts the amplitude of the decoded signal by using the generated coefficient, and thereby adjusts the audio volume of the audio signal output by the audio signal processing apparatus 100 (S106).

If processing of all frames has not been completed (No in S107), the audio signal processing apparatus 100 repeats the above processing (returns to S101).

As described above, the audio signal processing apparatus 100 according to Embodiment 1 of the present invention detects a change in the attribute information (for example, a change in period 7B shown in FIG. 5, or the like), and upon detection of a change, processes the decoded signal (audio signal 3Ba) into a processed signal (audio signal 5Bi) by using only either at least one piece of additional data before the change (for example, DRC data 4B) or at least one piece of additional data after the change (for example, DRC data 4Ba) (if only either one of these is used, only the one that avoids inappropriate amplitude 6Bh).

It is thereby possible to prevent additional data (DRC data 4B) for processing the audio signal (audio signal 3Bb) having attribute information (the attribute information in a stereo broadcast) different from the attribute information of the target audio signal (audio signal 3Ba) from being used to process the target audio signal (audio signal 3Ba). Accordingly, it is possible to prevent an audio signal that should be processed to have a small amplitude from being processed to have a large amplitude (see audio signal 5Bh shown in FIG. 4), and thus a degradation in subjective sound quality can be prevented.

The attribute information may be information indicating the presence or absence of additional data. In other words, the attribute information may be information indicating whether or not additional data is associated with the coded data. At this time, the attribute information may be contained in the header of a frame as shown in FIG. 2, or may be contained in the data block.

In this case, the detection unit 120 detects a change in the presence or absence of additional data between the target frame and the adjacent frame by referring to the attribute information. For example, it may be the case where frames for a multi-channel broadcast include additional data, but frames for a stereo broadcast do not include additional data.

For example, as described above, if the additional data of the target frame and the additional data of the preceding frame are different, the volume adjustment unit 141 calculates a volume adjustment coefficient by smoothing these two pieces of additional data, and then adjusts the amplitude of the target frame by using the calculated coefficient. This processing will be described below in further detail.

If, in the case where the target frame does not include additional data and the preceding frame includes additional data, a change in the attribute information is detected between the target frame and the preceding frame by the detection unit 120, the processing unit 140 processes the decoded signal by using the additional data of the target frame as described above. In this case, however, the target frame does not include additional data, and thus the processing unit 140 does not process the decoded signal of the target frame.

It is thereby possible to prevent the additional data of the preceding frame being used to process the decoded signal of the target frame as indicated by the problem shown in FIG. 4, and as a result a degradation in sound quality can be suppressed.

Alternatively, the attribute information may, in the case where a change occurs in the attribute information (see Yes in S103), be information indicating that the property of the audio signal has changed significantly. In other words, the attribute information may be information indicating a transition in audio content. For example, the attribute information may be information indicating a sampling frequency, the number of quantization bits, a coding scheme or the like.

Also, the adjacent frame may be the frame (following frame) immediately after the target frame. That is, the processing unit 140 may process the decoded signal by using the additional data of the target frame and the additional data of the following frame. Specifically, in the case where the DRC data of the target frame and the DRC data of the following frame are different, the volume adjustment unit 141 smoothes the DRC data of the target frame and the DRC data of the following frame so as to calculate a volume adjustment coefficient. Then, the volume adjustment unit 141 adjusts the amplitude of the decoded signal of the target frame by using the calculated coefficient.

In this case, the detection unit 120 detects whether or not the attribute information has changed between the target frame and the following frame. In other words, the detection unit 120 detects whether the attribute information of the target frame and the attribute information of the following frame are the same or different.

If a change is detected by the detection unit 120, the processing unit 140 processes the decoded signal by using at least one piece of additional data before detection of the change. Specifically, the volume adjustment unit 141 adjusts the amplitude of the decoded signal by using the DRC data of the target frame.

If, on the other hand, a change is not detected by the detection unit 120, the processing unit 140 processes the decoded signal of the target frame by using the additional data of the target frame and additional data other than the additional data of the target frame. Specifically, the volume adjustment unit 141 may calculate a volume adjustment coefficient by smoothing the DRC data of the target frame and the DRC data of the following frame, and adjust the amplitude of the decoded signal of the target frame by using the calculated coefficient.

As described above, in the audio signal processing apparatus according to Embodiment 1 of the present invention, the DRC data used for smoothing may be the DRC data of the preceding frame or the DRC data of the following frame.

As such, for example, the following operation may be performed.

In that operation, an amplitude (for example, amplitude 6Aa shown in FIG. 5) is determined.

Then, control is performed so as to generate a third audio signal (third audio signal 5Aa) in which the amplitude of a first audio signal (first audio signal 3Aa) indicating audio in a first period (for example, first period 7Aa) is changed to the determined amplitude (amplitude 6Aa).

When determining the amplitude (amplitude 6Aa), the determination is performed based on the DRC data (DRC data 4A) of a second audio signal (second audio signal 3Ab) in a second period (for example, second period 7Ab) close to (similar to, in a neighborhood of) the first period (first period 7Aa).

The first audio signal indicates the audio of the first period, and the second audio signal may indicate the audio of another second period.

One period being close to another period refers to a time period that is in the neighborhood of the other period.

Specifically, the determination of the amplitude may be performed based on one or more pieces of data (for example, the two pieces of DRC data 4A and 4Aa) including such DRC data.

However, as described above, it is not limited to situations in which the type (stereo broadcast) of the second audio signal (second audio signal 3Xb (for example, 3Ab)) determined from the DRC data of that audio signal is the same as the type (stereo broadcast) of the first audio signal (first audio signal 3Xa (3Aa)) (the case of period 7A).

Specifically, a situation can arise in which the type (stereo broadcast) of the second audio signal (second audio signal 3Xb (for example, 3Bb)) is different from the type (multi-channel broadcast) of the first audio signal (first audio signal 3Xa (3Ba)) (the case of period 7B).

That is, only when the type is the same (the case of period 7A), the amplitude (amplitude 6Aa) determined based on the DRC data (DRC data 4A) of the second audio signal (second audio signal 3Ab) will be an appropriate amplitude, and thus the level of sound quality of the third audio signal (third audio signal 5Aa) having that amplitude is considered to be relatively high.

On the other hand, when the type is different (the case of period 7B), the amplitude determined based on the DRC data (DRC data 4B) of the second audio signal (second audio signal 3Bb) will be an inappropriate amplitude (amplitude 6Bh shown in FIG. 4), and thus the level of sound quality of the third audio signal (third audio signal 5Bh shown in FIG. 4) having that amplitude is considered to be relatively low.

In view of the above, it may be determined (detected) whether the type of the second audio signal (second audio signal 3Xb) is the same (second audio signal 3Ab) or different (second audio signal 3Bb) (S103 in FIG. 6).

Only if it is determined that the type is the same (second audio signal 3Ab, No in S103), the amplitude is determined based on the DRC data (DRC data 4A) of the neighboring second period (period 7Ab). Accordingly, only in this case (No in S103, period 7A), the determined amplitude is set to an amplitude (amplitude 6Aa) determined based on the DRC data (DRC data 4A) of the neighboring period (S104, S106).

If, on the other hand, it is determined that the type is different (second audio signal 3Bb, Yes in S103), the determination based on the DRC data (DRC data 4B) of the neighboring second period (period 7Bb) is not performed. Accordingly, in this case (Yes in S103, period 7B), rather than being set to an amplitude (inappropriate amplitude 6Bh shown in FIG. 4) determined based on the DRC data (DRC data 4B) of the neighboring period, the determined amplitude is set to an amplitude (appropriate amplitude 6Bi shown in FIG. 5) other than that amplitude (S105, S106).

With this configuration, not only is the amplitude appropriate (amplitude 6Aa) and the sound quality high in the case where the type is the same (the case of period 7A), but also an inappropriate amplitude (amplitude 6Bh shown in FIG. 4) is avoided and an appropriate amplitude (amplitude 6Bi shown in FIG. 5) is provided in the case where the type is different (the case of period 7B). It is thereby possible to more reliably provide an appropriate amplitude.

Figure 9:
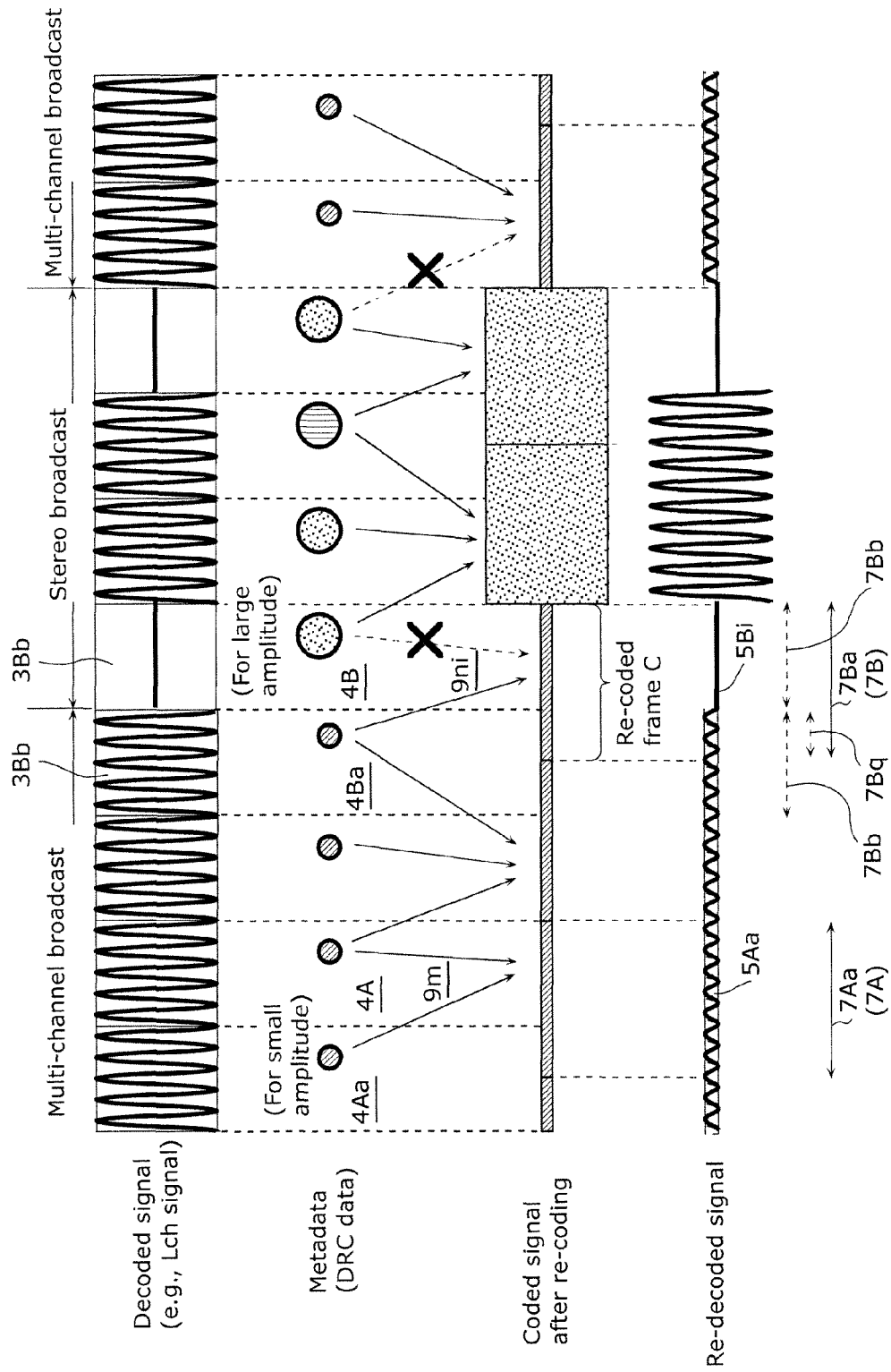
FIG. 9 is a diagram illustrating the operations and effects of the audio signal processing apparatus according to Embodiment 2 of the present invention.

Note that it may be possible to generate DRC data (for example, DRC data 241*a* shown in FIG. 7) whose adjusted amplitude resulting from amplitude adjustment with that DRC data (for example, DRC data 241*a* shown in FIG. 7 described later, DRC data 9*ni* or the like shown in FIG. 9) is the amplitude of the third audio signal that is generated (see period 7Bq of audio signal 5Bi shown in FIG. 9, or third audio signal 5Aa, 5Bi shown in FIG. 5).

The determined amplitude may be an amplitude obtained as a result of adjustment with the generated DRC data (see the above-mentioned amplitude 6Aa, 6Bi).

By DRC data (DRC data 241*a*) being generated in this way, the amplitude of the third audio signal that is generated may be controlled so as to be the amplitude obtained as a result of adjustment with this DRC data.

The third audio signal that is generated may have corresponding DRC data. And, the amplitude of the third audio signal may be set to an appropriate amplitude as described above, as a result of being set to an amplitude obtained by adjustment using the corresponding DRC data.

Also, a coded signal, obtained as a result of coding a signal containing first and second audio signals, before re-coding may be processed (for example, a bit stream (see the above-mentioned bit stream 100*a*) that is decoded by an audio signal processing apparatus 200 shown in FIG. 7 described later).

Figure 7:
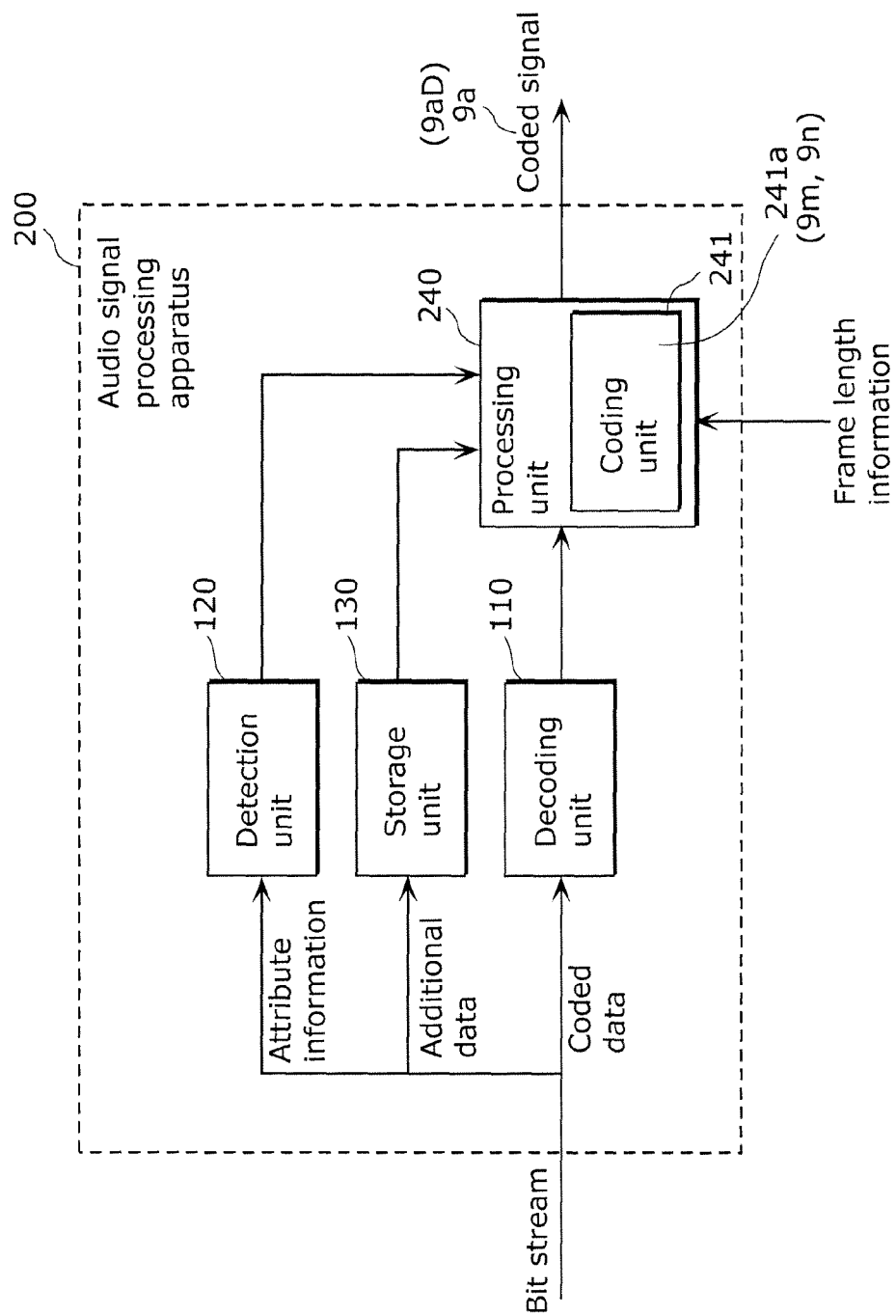
FIG. 7 is a block diagram showing an example of a configuration of an audio signal processing apparatus according to Embodiment 2 of the present invention.

In other words, such a coded signal before re-coding may be re-coded into a re-coded signal obtained by coding a signal containing a third audio signal (see coded signal 9*a* shown in FIG. 7).

The third audio signal may be generated by decoding the re-coded signal into a signal containing the third audio signal to generate a signal that includes the third audio signal.

When generating the third audio signal by decoding performed after re-coding, control may be performed such that the generated third audio signal has an appropriate amplitude as described above.

Note that a plurality of second periods (two periods 7Bb shown in FIG. 9) may be provided, and each second period may have DRC data (DRC data 4Ba, 4B).

Also, each second period may have a second audio signal (see two second audio signals 3Bb).

Then, with respect to each second audio signal, it may be determined whether the type (the type of the second audio signal 3Bb on the left side being multi-channel broadcast, the type of the second audio signal 3Bb on the right side being stereo broadcast) is the same (see audio signal 3Bb on the left side) as or different (see audio signal 3Bb on the right side) from the type of the first audio signal (the type being multi-channel broadcast in period 7Bq) in the first period (for example, period 7Bq of period 7Ba shown in FIG. 9).

Processing may be performed based on zero or more pieces of DRC data (the one piece of DRC data 4Ba) including the DRC data (DRC data 4Ba) of a second audio signal (second audio signal 3Bb on the left side) that has been determined to be of the same type but not including the DRC data (DRC data 4B) of a second audio signal (second audio signal 3Bb on the right side) that has been determined to be of a different type.

That is, the amplitude of the third audio signal that is generated (for example, a portion corresponding to period 7Bq of audio signal 5Bi, or the audio signal 5Bi in the entire period 7Ba, which is the period of the audio signal 5Bi) may be determined based on 0 or more pieces of DRC data.

As described above, for example, when an audio signal of one type is an audio signal for a stereo broadcast, an audio signal of the other type that is different from (i.e., not the same as) the one type may be an audio signal for a multi-channel broadcast.

Also, the sampling frequency of the audio signal of one type may be different from that of the audio signal of the other (i.e., different) type.

Likewise, for example, the number of quantization bits may be different. Alternatively, the coding scheme may be different.

When determining the amplitude based on the DRC data of the neighboring second period, for example, processing that is the same as the smoothing disclosed in NPL 1 (see smoothing 4x shown in FIG. 4) may be performed.

When determining the amplitude, amplitudes at one or more times may be determined by determining an amplitude at each time instant during the first period (see, for example, first period 7Ba shown in FIG. 4).

As the DRC data, there may be DRC data for a small amplitude whose amplitude determined from this DRC data is relatively small (see DRC data 4Ba shown in FIG. 9) and DRC data for a large amplitude whose amplitude determined from this DRC data is relatively large (see DRC data 4B shown in FIG. 9).

That is, there may be a first case where the DRC data in the first period (for example, period 7Bq shown in FIG. 9) of the first audio signal is DRC data for a small amplitude (DRC data 4Ba) or a second case where the DRC data in the first period of the first audio signal is DRC data for a large amplitude (DRC data 4B).

Only in the case of the first case (in the case of the DRC data being for a small amplitude), the level of sound quality is reduced (for example, a significant reduction that causes an adverse effect and the like), and in the second case (in the case of the DRC data being for a large amplitude), the level of sound quality need not be reduced.

It may be determined whether the DRC data corresponds to the first case or the second case.

Only if it is determined that the DRC data corresponds to the first case (in the case of the DRC data being for a small amplitude), the above processing may be performed. It is thereby possible to maintain the improvement in sound quality.

If it is determined that the DRC data corresponds to the second case (in the case of the DRC data being for a large amplitude), the above processing need not be performed.

It is thereby possible to reduce the amount of processing.

Accordingly, since the amount of processing is reduced while maintaining the improvement in sound quality, both high sound quality and a reduced amount of processing can be achieved.

Embodiment 2

In an audio signal processing apparatus according to Embodiment 2 of the present invention, the processing unit re-codes the decoded signal in units of frames of a frame length (for example, the frame length of a frame containing 1536 samples) that is different from the frame length (for example, the frame length of a frame containing 1024 samples) of the frames included in the bit stream. The processing unit according to Embodiment 2 of the present invention is configured to, if a change is not detected by the detection unit, generate additional data corresponding to a re-coded frame by using at least two pieces of additional data stored in the storage unit, and if a change is detected by the detection unit, generate additional data corresponding to a re-coded frame by using only either at least one piece of additional data before detection of the change or at least one piece of additional data after detection of the change among additional data stored in the storage unit (see the description given above).

The configuration of the audio signal processing apparatus according to Embodiment 2 of the present invention will be described first.

FIG. 7 is a block diagram showing an example of the configuration of the audio signal processing apparatus 200 according to Embodiment 2 of the present invention.

The audio signal processing apparatus 200 shown in FIG. 7 is different from the audio signal processing apparatus 100 according to Embodiment 1 in that a processing unit 240 is provided in place of the processing unit 140. The following description will be given, focusing on differences from Embodiment 1, and thus a detailed description of points that are the same as Embodiment 1 is not given here. Constituent elements that are the same as those of FIG. 1 are given the same reference numerals.

An audio signal processing apparatus 200 according to Embodiment 2 of the present invention is a transcoding apparatus that decodes a bit stream coded with a predetermined coding scheme and re-codes the decoded result with a different coding scheme. In the present embodiment, a case will be described in which the per-frame length is different between an input bit stream and a re-coded bit stream.

The processing unit 240 re-codes the decoded signal in units of frames of a frame length different from that of frames included in the bit stream. The frame length is indicated by, for example, the number of samples included in a single frame. In Embodiment 2 of the present invention, the processing unit 240 includes a coding unit 241.

The coding unit 241 generates a re-coded frame (coded signal 9a) by coding the decoded signal of the target frame. Here, the frame length of the target frame and the frame length of the re-coded frame are different. Accordingly, a decoded signal having a length corresponding to the frame length of the re-coded frame has been generated, the coding unit 241 generates a re-coded frame by re-coding the decoded signal.

Furthermore, the coding unit 241 generates additional data (DRC data 241a) corresponding to the re-coded frame. Specifically, the coding unit 241 decodes the re-coded frame based on DRC data, and thereby generates DRC data (DRC data 241a) for adjusting the amplitude of the generated re-decoded signal.

If a change is not detected by the detection unit 120, the coding unit 241 generates additional data (DRC data 241a) corresponding to the re-coded frame by using at least two pieces of additional data stored in the storage unit 130. If a change is detected by the detection unit 120, the coding unit 241 generates additional data corresponding to the re-coded data by using only either at least one piece of additional data before detection of the change or at least one piece of additional data after detection of the change among additional data stored in the storage unit 130 (see the description given above).

A detailed description will be given of a case in which, for example, the attribute information indicates the number of channels of the audio signal and the detection unit 120 detects whether or not the number of channels of the audio signal has changed between the target frame and the adjacent frame by referring to the attribute information.

When a change is detected by the detection unit 120 and the boundary between the target frame and the adjacent frame does not coincide with the boundary between re-coded frames, the coding unit 241 generates additional data corresponding to the re-coded frame by using either one having a greater number of channels of at least one piece of additional data before detection of the change and at least one piece of additional data after detection of the change.

It is often the case that an audio signal having a great number of channels contains additional data for a small amplitude. Accordingly, the coding unit 241 generates additional data after re-coding by using the additional data for a small amplitude.

Operations of the audio signal processing apparatus 200 according to Embodiment 2 of the present invention will be described below.

Figure 8:
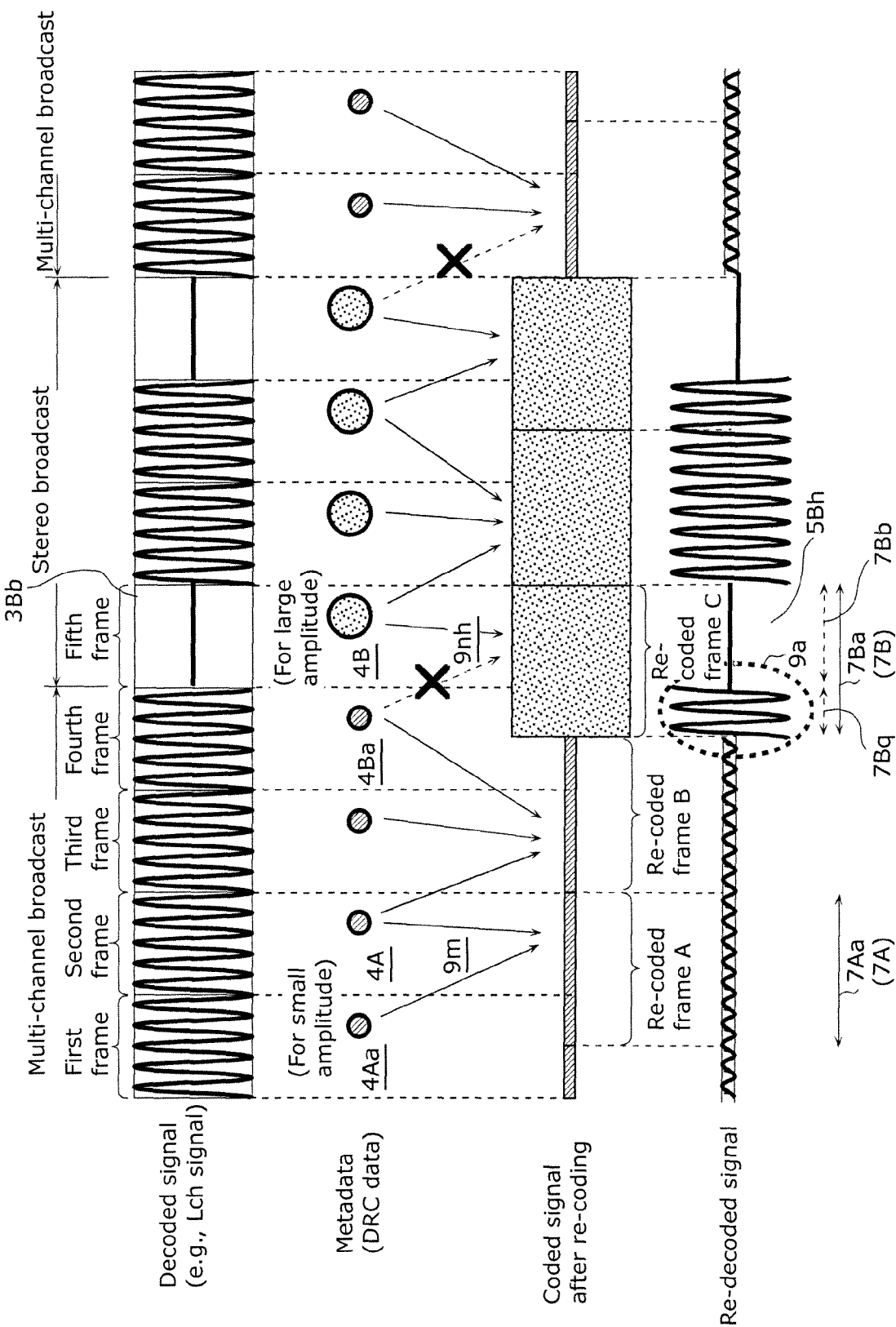
FIG. 8 is a diagram illustrating a problem that is solved by the audio signal processing apparatus according to Embodiment 2 of the present invention.

FIG. 8 is a diagram illustrating a problem that is solved by the audio signal processing apparatus 200 according to Embodiment 2 of the present invention.

FIG. 8 shows an example in which an input bit stream is converted to an output bit stream, the input bit stream including a plurality of frames, each including 1024 samples, and the output bit stream including a plurality of re-coded frames, each including 1536 samples.

As shown in FIG. 8, the frame length of the input bit stream and the frame length of the output bit stream are different, and thus the coding unit 241 generates, for each re-coded frame, additional data (DRC data 241a shown in FIG. 7) corresponding to the re-coded frame. In the example shown in FIG. 8, new additional data is generated by using the additional data corresponding to the decoded signal of the re-coded frame.

For example, a re-coded frame A includes a part of the decoded signal of a first frame and the entire decoded signal of a second frame.

Accordingly, additional data corresponding to the re-coded frame A is generated based on the additional data of the first frame and the additional data of the second frame.

Likewise, a re-coded frame B includes the entire decoded signal of a third frame and a part of the decoded signal of a fourth frame.

Accordingly, additional data corresponding to the re-coded frame B is generated based on the additional data of the second, third and fourth frames.

The reason that the additional data of the second frame is used is, as described in Embodiment 1, to prevent a sudden change from the preceding re-coded frame.

As described above, the input bit stream and the output bit stream have different frame lengths. For this reason, there are cases where, as indicated by a re-coded frame C in FIG. 8, a plurality of frames (fourth and fifth frames) having different attribute information are included. In this case, as described in Embodiment 1, a change in the attribution information is detected between the fourth frame and the fifth frame. Accordingly, the processing unit 240 generates additional data (DRC data 9nh) for the re-coded frame C by using the fifth frame. In this case, DRC data for a large amplitude (DRC data 4B) is multiplexed as the additional data of the re-coded frame C.

Accordingly, when decoding the re-coded frame C, the amplitude of the decoded signal for a multi-channel broadcast that should have a small amplitude is changed to a large amplitude as shown in FIG. 8 (the re-decoded signal of the re-coded frame C, audio signal 5Bh, portion 9a of period 7Bq in audio signal 5Bh).

As described above, in the case where the boundary between the target frame and the adjacent frame does not coincide with the boundary between re-coded frames, a problem arises in that additional data for a large amplitude is multiplexed into a frame into which additional data for a small amplitude should be multiplexed, resulting in a degradation in subjective sound quality.

FIG. 9 is a diagram illustrating the operations and effects of the audio signal processing apparatus 200 according to Embodiment 2 of the present invention.

In the audio signal processing apparatus 200 according to Embodiment 2 of the present invention, the detection unit 120 detects whether or not the number of channels of the audio signal has changed by referring to the attribute information. If a change is detected in the number of channels, and the boundary between the preceding frame and the target frame, which is the point in time when the change was detected, does not coincide with the boundary between re-coded frames, the processing unit 240 generates additional data (DRC data 9ni) corresponding to the re-coded frame by using the additional data (DRC data 4Ba) of the frame having a greater number of channels.

Specifically, as shown in FIG. 9, additional data corresponding to the re-coded frame C is generated by referring only to the additional data (DRC data 4Ba) of the fourth frame. It is thereby possible to reduce the amplitude of the audio signal for a multi-channel broadcast to a small amplitude.

Figure 10:
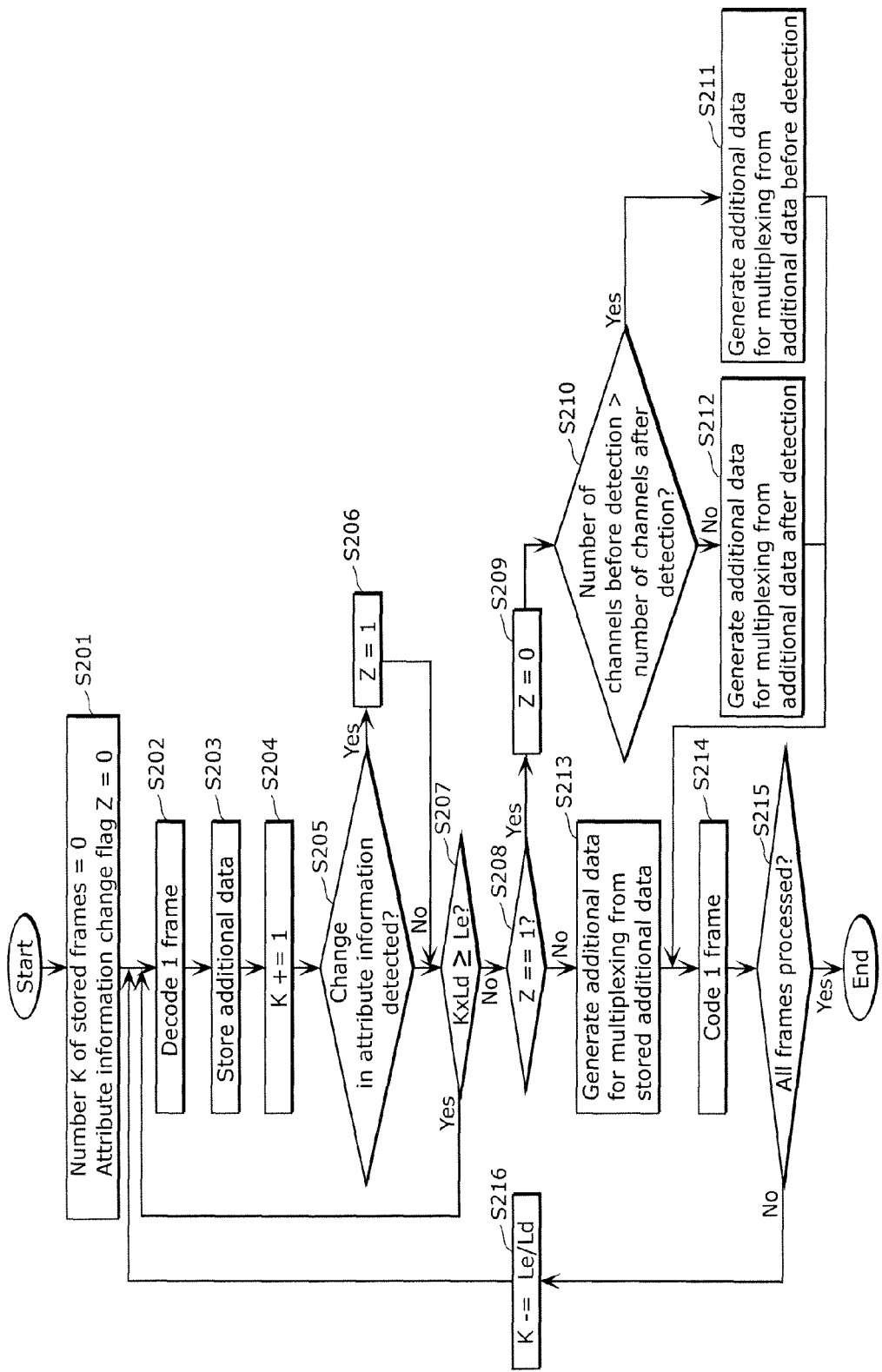
FIG. 10 is a flowchart illustrating an example of operations of the audio signal processing apparatus according to Embodiment 2 of the present invention.

FIG. 10 is a flowchart illustrating an example of operations of the audio signal processing apparatus 200 according to Embodiment 2 of the present invention.

First, the audio signal processing apparatus 200 sets parameters required for transcoding (S201).

For example, the audio signal processing apparatus 200 includes a control unit (not shown in FIG. 7) that performs overall control on the audio signal processing apparatus 200, and the control unit sets both a number K of stored frames and an attribute information change flag Z to 0.

The number K of stored frames is a parameter indicating the number of frames stored in a memory (not shown in FIG. 7) for temporarily storing the decoded signal.

The attribute information change flag Z is a parameter indicating whether or not the attribute information has changed between two successive frames. Specifically, if Z=0, this indicates that the attribute information has not changed. If Z=1, this indicates that the attribute information has changed.

Next, the decoding unit 110 generates a decoded signal by decoding a single frame's worth of coded data (S202).

That is, the decoding unit 110 decodes the coded data of the target frame.

The generated decoded signal of the target frame is stored in the above-mentioned memory.

Next, the storage unit 130 stores the additional data of the target frame therein (S203).

Since decoding of a single frame has been completed, the audio signal processing apparatus 200 increments the number K of stored frames (S204).

Next, the detection unit 120 detects whether or not the attribute information has changed (S205).

Specifically, the detection unit 120 detects whether or not the attribute information has changed between the preceding frame and the target frame. That is, the detection unit 120 detects whether the attribute information of the preceding frame and the attribute information of the target frame are the same or different.

In the present embodiment, the detection unit 120 detects whether or not the number of channels of the preceding frame and the number of channels of the target frame are the same by referring to the attribute information. If it is detected that the number of channels of the preceding frame and the number of channels of the target frame are the same, the detection unit 120 determines that the attribute information has not changed (see period 7A shown in FIG. 8). If it is detected that the number of channels of the preceding frame and the number of channels of the target frame are different, the detection unit 120 determines that the attribute information has changed (see period 7B).

If a change in the attribute information is detected (Yes in S205, period 7B), the audio signal processing apparatus 200 sets the attribute information change flag Z to 1 (S206).

Next, the coding unit 241 determines whether or not decoded signals sufficient to perform re-coding have been generated, or in other words, stored in the memory (S207).

Specifically, the coding unit 241 determines whether or not decoded signals having a frame length greater than or equal to the frame length for re-coding processing have been generated.

For example, the coding unit 241 determines whether or not K×Ld≥Le is satisfied. As used herein, Ld represents the frame length before re-coding (specifically, the frame length of an input bit stream), and Le represents the frame length after re-coding (specifically, the frame length of an output bit stream).

Next, if a change is detected in the attribute information, or in other words, if the attribute information change flag Z is 1 (Yes in S208, period 7B), the audio signal processing apparatus 200 resets the attribute information change flag Z to 0 (S209). It is sufficient that resetting of the attribute information change flag Z is performed before processing of the next frame is started.

Then, if the number of channels before detection of the change is greater than the number of channels after detection of the change (Yes in S210), the coding unit 241 generates additional data for re-coding (DRC data 9ni) used for multiplexing into an output bit stream by using the additional data before detection of the change (for example, DRC data 4Ba) (S211).

If, on the other hand, the number of channels before detection of the change is less than the number of channels after detection of the change (No in S210), the coding unit 241 generates additional data for re-coding used for multiplexing into an output bit stream by using the additional data after detection of the change (S212).

In the manner described above, the coding unit 241 generates additional data corresponding to a re-coded frame by using the additional data attached to the decoded signal having a greater number of channels.

If a change is not detected in the attribute information, or in other words, if the attribute information change flag Z is 0 (No in S208, period 7Aa), the coding unit 241 generates additional data for re-coding that is to be multiplexed into the output bit stream, by using the additional data stored in the storage unit 130 (for example, both of the two DRC data 4A and 4Aa) (S213).

After generation of additional data corresponding to the re-coded frame has been completed, the coding unit 241 codes the decoded signal of a single frame (S214).

If processing of all frames has not been completed (No in S215), the audio signal processing apparatus 200 replaces the value of the number K of stored frames with a value obtained by subtracting Le/Ld from the current value of the number K of stored frames (S216). Then, the above processing is repeated (the procedure returns to S202).

As described above, the audio signal processing apparatus 200 according to Embodiment 2 of the present invention re-codes the decoded signal in units of frames of a frame length different from the frame length of the frames included in the bit stream. At this time, in the case where a change has been detected in the attribute information by the detection unit 120 and the boundary between the target frame and the adjacent frame does not coincide with the boundary between re-coded frames (the case of period 7Ba), the audio signal processing apparatus 200 generates additional data (DRC data 9ni) corresponding to a re-coded frame by using only either the additional data before detection of the change or the additional data after detection of the change (by using DRC data 4Ba and not using DRC data 4B).

Specifically, additional data corresponding to the re-coded data is generated by using the additional data of the frame having a greater number of channels.

It is thereby possible to prevent a degradation in sound quality as a result of additional data for a large amplitude (see DRC data 9nh shown in FIG. 8) being multiplexed into a frame (see a frame corresponding to period 7Ba) into which additional data for a small amplitude should be multiplexed.

As in Embodiment 1, the attribute information may be information indicating the presence or absence of additional data. In other words, the attribute information may be information indicating whether or not additional data is associated with the coded data.

In this case, the detection unit 120 detects a change in the presence or absence of additional data between the target frame and the adjacent frame by referring to the attribute information. There are cases, for example, where frames for a multi-channel broadcast contain additional data but frames for a stereo broadcast do not contain additional data.

In the case where a change has been detected by the detection unit 120, and the boundary between the target frame and the adjacent frame does not coincide with the boundary between re-coded frames, the coding unit 241 generates additional data corresponding to a re-coded frame by using, as either the at least one piece of additional data before detection of the change or at least one piece of additional data after detection of the change, the additional data of the frame in which additional data exists. Since additional data that exists is used, additional data for a small amplitude can thereby be multiplexed as the additional data of the re-coded frame.

As described above, in the case where there are two or more second periods (second periods 7Bb) as neighboring second periods, the amplitude of the third audio signal that is generated (for example, the audio signal of a portion corresponding to period 7Bq in audio signal 5Bi of period 7Ba, or audio signal 5Bi itself) may be determined from two or more pieces of DRC data including the DRC data (DRC data 4B, 4Ba) of the second periods.

The period of the third audio signal (for example, period 7Bq) may be different from at least one of the two or more DRC data periods.

That is, for example, the length of the period of the third audio signal (the length of period 7Bq, the length of period 7Ba, for example, the length corresponding to 1536 samples in the example shown in FIG. 9) may be different from that (the length of 1024 samples) of any of the two or more DRC data periods (periods 7Bb).

More specifically, as described above, for example, each of the two or more pieces of DRC data may be data of the coded signal before re-coding, which is performed by the audio signal processing apparatus 200. The generated third audio signal may be an audio signal obtained as a result of the coded signal before re-coding being re-coded as described above.

The foregoing has been a description of the audio signal processing apparatus and audio signal processing method according to the present invention based on embodiments, but the present invention is not limited to these embodiments. Embodiments implemented by making various modifications conceived by a person skilled in the art to any of the embodiments described herein or embodiments configured by combining the constituent elements of different embodiments without departing from the spirit of the present invention are also encompassed within the scope of the present invention.

For example, the additional data may be a down-mix coefficient. A down-mix coefficient is, for example, a parameter used to convert a multi-channel audio signal to a stereo audio signal.

Also, the above embodiments have described an example in which adjustment of the amplitude of the signal (volume adjustment) and re-coding are used as the processing performed on the decoded signal, but the present invention is not limited thereto.

Also, the units that perform processing in the audio signal processing apparatuses according to Embodiments 1 and 2 are typically implemented as LSIs (Large Scale Integration), which are integrated circuits. They may be individual chips, or may be partially or wholly integrated into a single chip.

The LSI may be called an IC (Integrated Circuit), a system LSI, a super LSI, or an ultra LSI depending on the degree of integration.

The method for implementing an integrated circuit is not limited to an LSI, and the integration circuit may be implemented by a dedicated circuit or a general-purpose processor. It is also possible to use an FPGA (Field Programmable Gate Array) that can be programmed after LSI production or a reconfigurable processor that enables reconfiguration of the connection and setting of circuit cells in the LSI.

Furthermore, if a technique for implementing an integrated circuit that can replace LSIs appears by another technique resulting from the progress or derivation of semiconductor technology, each of the units that perform processing may of course be integrated by using that technique. Application of biotechnology or the like is possible.

It is also possible for some or all of the functions of the audio signal processing apparatuses according to Embodiments 1 and 2 of the present invention to be implemented by a processor such as a CPU (Central Processing Unit) executing a program.

Furthermore, the present invention may be a program as described above, or a recording medium in which such a program is recorded. Needless to say, the program can be distributed via transmission media such as the Internet.

All of the numerical values used herein are merely examples to specifically describe the present invention, and thus the present invention is not limited to the numerical values used herein. The connection relationships between constituent elements are also merely examples to specifically describe the present invention, and thus the connection relationships for implementing the functions of the present invention are not limited thereto.

Furthermore, the above embodiments are implemented by using hardware and/or software, but the configuration using hardware can also be implemented by using software. Likewise, the configuration using software can also be implemented by using hardware.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The audio signal processing apparatus and audio signal processing method according to the present invention have the effects of suppressing a degradation in subjective sound quality (see audio signal 5Bh having inappropriate amplitude 6Bh shown in FIG. 4) and enhancing the quality of sound, and are applicable to, for example, audio players, digital televisions, digital recorders and the like in order to further enhance sound quality.

The invention claimed is:

1. An audio signal processing apparatus that processes a bit stream generated by coding an audio signal on a frame-by-frame basis,
the bit stream including, for each frame,
coded data representing a coded audio signal,
additional data on an amplitude of a decoded signal generated by decoding the coded data, and
attribute information indicating a property of the coded data,
the audio signal processing apparatus comprising:
a decoding unit configured to decode coded data of a target frame to generate the decoded signal;
a processing unit configured to process the decoded signal generated by the decoding unit;
a detection unit configured to detect whether or not there has been a change in the attribute information between the target frame and an adjacent frame that is consecutive to the target frame; and
a storage unit configured to store at least two pieces of additional data including additional data of the target frame,
wherein the processing unit is configured to:
when the change is not detected by the detection unit, process the decoded signal of the target frame by using the at least two pieces of additional data stored in the storage unit;
when the change is detected by the detection unit, process the decoded signal of the target frame by using only either at least one piece of additional data before detection of the change or at least one piece of additional data after detection of the change among the additional data stored in the storage unit,
re-code the decoded signal in units of frames of a frame length different from a frame length of the frames included in the bit stream;
when the change is not detected by the detection unit, generate additional data corresponding to a re-coded frame by using at least two pieces of additional data stored in the storage unit; and
when the change is detected by the detection unit, generate additional data corresponding to a re-coded frame by using only either at least one piece of additional data before detection of the change or at least one piece of additional data after detection of the change among the additional data stored in the storage unit, and
wherein the attribute information is information indicating the number of channels of the coded audio signal of a corresponding frame,
the detection unit is configured to detect whether or not there has been a change in the number of channels of the audio signal between the target frame and the adjacent frame by referring to the attribute information, and
the processing unit is configured to, when the change is detected by the detection unit and a boundary between the target frame and the adjacent frame does not coincide with a boundary between two re-coded frames, generate additional data corresponding to a re-coded frame by using, as either the at least one piece of additional data before detection of the change or at least one piece of additional data after detection of the change, additional data of either the target frame or the adjacent frame, whichever has a greater number of channels, so as to reduce the amplitude of the audio signal, and the audio signal is being output as an audible signal with an adjusted volume by the processing unit.

2. An audio signal processing method for processing a bit stream generated by coding an audio signal on a frame-by-frame basis, the bit stream including, for each frame,
coded data representing a coded audio signal,
additional data on an amplitude of a decoded signal generated by decoding the coded data, and
attribute information indicating a property of the coded data, the audio signal processing method comprising:
decoding coded data of a target frame to generate the decoded signal;
processing the decoded signal generated in the decoding; and
detecting whether or not there has been a change in the attribute information between the target frame and an adjacent frame that is consecutive to the target frame,
wherein in the processing,
when the change is not detected in the detecting, the decoded signal of the target frame is processed by using at least two pieces of additional data including additional data of the target frame,
when the change is detected in the detecting, the decoded signal of the target frame is processed by using only either at least one piece of additional data before detection of the change or at least one piece of additional data after detection of the change, re-coding the decoded signal in units of frames of a frame length different from a frame length of the frames included in the bit stream;

when the change is not detected in the detecting, generating additional data corresponding to a re-coded frame by using at least two pieces of additional data of the target frame; and when the change is detected in the detecting, generating additional data corresponding to a re-coded frame by using only either at least one piece of additional data before detection of the change or at least one piece of additional data after detection of the change, and wherein the attribute information is information indicating the number of channels of the coded audio signal of a corresponding frame, detecting whether or not there has been a change in the number of channels of the audio signal between the target frame and the adjacent frame by referring to the attribute information, and, when the change is detected and a boundary between the target frame and the adjacent frame does not coincide with a boundary between two re-coded frames, generating additional data corresponding to a re-coded frame by using, as either the at least one piece of additional data before detection of the change or at least one piece of additional data after detection of the change, additional data of either the target frame or the adjacent frame, whichever has a greater number of channels, so as to reduce the amplitude of the audio signal, and outputting the audio signal as an audible signal with an adjusted volume.

* * * * *